(12) United States Patent
Chaji et al.

(10) Patent No.: US 12,068,428 B2
(45) Date of Patent: Aug. 20, 2024

(54) VERTICAL SOLID STATE DEVICES

(71) Applicant: VueReal Inc., Waterloo (CA)

(72) Inventors: Gholamreza Chaji, Waterloo (CA);
Ehsanollah Fathi, Waterloo (CA);
Hossein Zamani Siboni, Waterloo (CA)

(73) Assignee: VueReal Inc., Waterloo (CA)

( * ) Notice: Subject to any disclaimer, the term of this patent is extended or adjusted under 35 U.S.C. 154(b) by 0 days.

(21) Appl. No.: 16/998,455

(22) Filed: Aug. 20, 2020

(65) Prior Publication Data

US 2020/0381582 A1 Dec. 3, 2020

Related U.S. Application Data

(63) Continuation of application No. 15/389,728, filed on Dec. 23, 2016, now Pat. No. 10,784,398.

(30) Foreign Application Priority Data

Dec. 24, 2015 (CA) .................................... 2916291
Mar. 18, 2016 (CA) .................................... 2924157

(51) Int. Cl.
*H01L 33/00* (2010.01)
*H01L 27/15* (2006.01)
*H01L 33/62* (2010.01)

(52) U.S. Cl.
CPC ........ *H01L 33/0037* (2013.01); *H01L 27/153* (2013.01); *H01L 33/62* (2013.01)

(58) Field of Classification Search
CPC ..... H01L 33/0037; H01L 33/08; H01L 33/20; H01L 33/36–387; H01L 33/48–648; H01L 33/54; H01L 33/60; H01L 33/62; H01L 27/153; H01L 27/15–156; H01L 27/326; H01L 2933/0033; H01L 2933/005; H01L 2933/0066–0091; H01L 2221/1068; H01L 2221/1078; H01L 21/28; H01L 21/28008; H01L 21/28079; H01L 21/2888;
(Continued)

(56) References Cited

U.S. PATENT DOCUMENTS 5,062,115 A * 10/1991 Thornton ................ H01S 5/423
372/50.122
5,216,263 A 6/1993 Paoli
(Continued)

FOREIGN PATENT DOCUMENTS

CN 101076900 11/2007
CN 102097477 B 10/2012
(Continued)

OTHER PUBLICATIONS

International Search Report and Written Opinion in International Application No. PCT/IB2018/052240, mailed Jul. 5, 2018 (12 pages).
(Continued)

*Primary Examiner* — Natalia A Gondarenko
(74) *Attorney, Agent, or Firm* — NIXON PEABODY LLP

(57) ABSTRACT

A vertical current mode solid state device comprising a connection pad and side walls comprising a metal-insulator-semiconductor (MIS) structure, wherein leakage current effect of the vertical device is limited through the side walls by biasing the MIS structure.

4 Claims, 28 Drawing Sheets

(58) Field of Classification Search
CPC ......... H01L 21/28255; H01L 21/28097; H01L 21/2815; H01L 21/4803–481; H01L 21/52; H01L 2021/60022; H01L 2021/60135; H01L 2021/60225; H01L 2021/60232; H01L 2021/6027
USPC ....... 257/40, 81, 72, 79, 86, 88, 89, 98–100, 257/33.013, 33.06; 438/26–29, 34, 38, 438/304, 596

See application file for complete search history.

(56) References Cited

U.S. PATENT DOCUMENTS

| | | | | |
|---|---|---|---|---|
| 5,893,721 | A * | 4/1999 | Huang | H01L 27/156 |
| | | | | 438/34 |
| 5,952,680 | A * | 9/1999 | Strite | H01L 33/325 |
| | | | | 257/89 |
| 6,040,590 | A | 3/2000 | O'Brien | |
| 6,417,514 | B1 | 7/2002 | Eneim | |
| 6,791,130 | B2 | 9/2004 | Chao | |
| 6,881,979 | B2 | 4/2005 | Starikov | |
| 7,170,100 | B2 | 1/2007 | Erchak | |
| 7,598,149 | B2 * | 10/2009 | Dawson | H01L 27/156 |
| | | | | 257/E21.377 |
| 7,943,954 | B2 * | 5/2011 | Wu | H01L 33/305 |
| | | | | 257/101 |
| 7,999,454 | B2 | 8/2011 | Winters | |
| 8,053,982 | B2 | 11/2011 | Bratkovski | |
| 8,182,304 | B2 | 5/2012 | Suh | |
| 8,754,425 | B2 * | 6/2014 | Anderson | B41J 2/45 |
| | | | | 257/94 |
| 9,312,437 | B2 * | 4/2016 | Epler | H01L 33/18 |
| 9,391,118 | B2 * | 7/2016 | Negley | H01L 21/2654 |
| 9,406,884 | B2 | 8/2016 | Chien | |
| 9,490,295 | B2 | 11/2016 | Chen | |
| 10,170,055 | B2 | 1/2019 | Kimura | |
| 2003/0012249 | A1 | 1/2003 | Eisenbeiser | |
| 2005/0087769 | A1 | 4/2005 | Yamazaki | |
| 2005/0116620 | A1 | 6/2005 | Kobayashi | |
| 2006/0097270 | A1 | 5/2006 | Yuri | |
| 2006/0157103 | A1 | 7/2006 | Sheats | |
| 2008/0224224 | A1 | 9/2008 | Vandenderghe | |
| 2008/0230792 | A1 | 9/2008 | Jiang | |
| 2009/0273293 | A1 | 11/2009 | Bratkovski | |
| 2010/0032691 | A1 | 2/2010 | Kim | |
| 2010/0207549 | A1 | 8/2010 | Meldrum | |
| 2011/0038150 | A1 | 2/2011 | Woodgate | |
| 2011/0240955 | A1 | 10/2011 | Windisch | |
| 2011/0316036 | A1 * | 12/2011 | Furukawa | H01L 33/08 |
| | | | | 257/99 |
| 2012/0217509 | A1 | 8/2012 | Kim | |
| 2012/0228603 | A1 | 9/2012 | Nakamura | |
| 2012/0313074 | A1 | 12/2012 | Schubert | |
| 2013/0049059 | A1 | 2/2013 | Odnoblyudov | |
| 2013/0088482 | A1 | 4/2013 | Nathan | |
| 2013/0126890 | A1 | 5/2013 | Bedell | |
| 2013/0146936 | A1 | 6/2013 | Tsai | |
| 2014/0159065 | A1 * | 6/2014 | Hu | H01L 24/80 |
| | | | | 438/34 |
| 2014/0159067 | A1 | 6/2014 | Sakariya | |
| 2014/0183501 | A1 | 7/2014 | Kim | |
| 2014/0252390 | A1 | 9/2014 | Yoon | |
| 2014/0374742 | A1 | 12/2014 | Tsang | |
| 2015/0187991 | A1 * | 7/2015 | McGroddy | H01L 33/30 |
| | | | | 257/13 |
| 2015/0364643 | A1 | 12/2015 | Sumitomo | |
| 2015/0380461 | A1 | 12/2015 | Robin | |
| 2016/0218143 | A1 | 7/2016 | Chaji | |
| 2017/0047391 | A1 | 2/2017 | You | |
| 2017/0186907 | A1 | 6/2017 | Chaji | |
| 2017/0186908 | A1 | 6/2017 | Robin | |
| 2018/0247922 | A1 | 8/2018 | Robin | |

FOREIGN PATENT DOCUMENTS

| | | |
|---|---|---|
| CN | 102160181 | 12/2013 |
| CN | 104885252 A | 9/2015 |
| CN | 105144387 | 3/2018 |
| EP | 2973715 | 10/2021 |
| JP | H02-256287 A | 10/1990 |
| TW | 201125421 A | 7/2011 |
| TW | 201528498 | 7/2015 |

OTHER PUBLICATIONS

International Search Report and Written Opinion in International Application No. PCT/IB2016/057995, mailed Apr. 24, 2017 (9 pages).

* cited by examiner

VERTICAL SOLID STATE DEVICES

CROSS-REFERENCE TO RELATED APPLICATIONS

This application is a continuation of U.S. Nonprovisional application Ser. No. 15/389,728, filed Dec. 23, 2016, entitled "Vertical Solid State Devices", now allowed, which claims priority to Canadian Patent Application No. 2,924,157, filed Mar. 18, 2016 and Canadian Patent Application No. 2,916,291, filed Dec. 24, 2015, each of which is hereby incorporated by reference herein in its entirety.

FIELD OF THE INVENTION

The present invention pertains to vertical solid state devices, lateral conduction manipulation of vertical solid state devices, and methods of manufacture thereof. The present invention also relates to the fabrication of an integrated array of microdevices. The array of microdevices is defined by an array of contacts on a device substrate or a system substrate.

BACKGROUND

Integrating micro optoelectronic devices into a system substrate can offer high performance and high functionality systems. In order to improve the cost and create higher pixel density devices, the size of the optoelectronic devices should be reduced. Examples of optoelectronic devices are sensors and light emitting devices, such as, for example, light emitting diodes (LEDs). As the size of these devices is reduced, however, device performance can start to suffer. Some reasons for reduced performance include but are not limited to higher leakage current due to defects, charge crowding at interfaces, imbalance charge, and unwanted recombinations such as Auger and nonradiative recombination.

Light Emitting Diodes (LED) and LED arrays can be categorized as a vertical solid state device. The microdevices may be sensors, Light Emitting Diodes (LEDs) or any other solid devices grown, deposited or monolithically fabricated on a substrate. The substrate may be the native substrate of the device layers or a receiver substrate where device layers or solid state devices are transferred to.

The system substrate may be any substrate, and can be rigid or flexible. The system substrate may be made of glass, silicon, plastics or any other commonly used material. The system substrate may also have active electronic components such as but not limited to transistors, resistors, capacitors or any other electronic component commonly used in a system substrate. In some cases the system substrate may be a substrate with electrical signal rows and columns. In one example the device substrate may be a sapphire substrate with LED layers grown monolithically on top of it and the system substrate may be a backplane with circuitry to derive micro-LED devices. As part of the vertical devices, metal-insulator-semiconductor (MIS) structures can be formed from a layer of metal, a layer of insulating material and a layer of semiconductor material.

Various transferring and bonding methods may be used to transfer and bond device layers to the system substrate. In one example heat and pressure may be used to bond device layers to a system substrate. In a vertical solid state device, the current flow in the vertical direction predominantly defines the functionality of the device. Light Emitting Diodes (LED) may be categorized as a vertical solid state device. Here, the proposed fabrication methods are used to limit the lateral current flow of these devices.

Patterning LED into micro size devices to create array of LEDs for display applications come with several issues including material utilization, limited PPI, and defect creation. In one example, in a vertical solid state device, the current flow in the vertical direction predominantly defines the functionality of the device. There remains a need for improved vertical solid state devices.

This background information is provided for the purpose of making known information believed by the applicant to be of possible relevance to the present invention. No admission is necessarily intended, nor should be construed, that any of the preceding information constitutes prior art against the present invention.

SUMMARY OF THE INVENTION

An object of the present invention is to provide vertical solid state devices with directed current.

In an aspect there is provided a vertical current mode solid state device comprising a connection pad and side walls comprising a metal-insulator-semiconductor (MIS) structure, wherein leakage current effect of the vertical device is limited through the side walls by biasing the MIS structure.

In an embodiment the device is connected to a circuit layer through at least one connection pad.

In another embodiment the current diverges from the perimeter of the vertical devices.

In another embodiment the device is a micro-LED device.

In another aspect there is provided a solid state device comprising an array of current mode devices in a continuous semiconductor bulk developed by resistance engineering of at least one conductive layer.

In an embodiment the connection pad modifies the resistance and defines the size of the individual vertical devices.

In another embodiment the resistance engineering comprises etching the at least one conductive layer.

In another embodiment the resistance engineering comprises metrical modification, modulation, or a combination thereof, of at least one conductive layer.

In another embodiment the device is a micro-LED device.

In another embodiment a mask is used to modify the lateral resistance of the at least one conductive layer.

In another embodiment resistance of the conductive layers is modified by oxidation.

In another aspect there is provided a method of fabricating a vertical solid state device comprising creating an array of vertical devices, each vertical device comprising a connection pad and side walls comprising a metal-insulator-semiconductor (MIS) structure, wherein leakage current effect of the vertical device is limited through the side walls by biasing the MIS structure.

In an embodiment the method further comprises connecting the device to a circuit layer through at least one connection pad.

In another embodiment the resistance of the conductive layers is modified by oxidation.

In another embodiment the vertical solid state device is created prior to transferring the device to a system substrate.

In another embodiment the vertical solid state device is created after being transferred onto a system substrate.

In another embodiment the vertical solid state device is created partially prior to transferring the device onto a system substrate and the vertical solid state device is completed after the device is transferred onto the system substrate.

In another aspect there is provided a method of manipulating the top conductive layer of a vertical device in which the functionality of the device is defined by vertical currents, the method comprising: top layer resistance engineering in which the lateral resistance of the top conductive layer is manipulated by changing a thickness or specific resistivity of the top layer; fully or partial etching modulation of the top layer of the vertical device; and material conductivity modulation in which the resistance of the top layer is modulated.

In an embodiment the material conductivity modulation is achieved by etching, counter doping, laser ablation, or a combination thereof.

In another embodiment modulation of the vertical device is performed by adding a metal (electrode)-insulator-semiconductor (MIS) into at least one surface of the vertical device.

In another embodiment the vertical device is an optoelectronic device.

In another aspect there is provided a method of pixelating a display device, the method comprising: defining a pixel pad connection on a backplane; and attaching an LED device with no current spreader or patterned current spreader layer to the backplane.

In an embodiment a bonding element is used to hold the LED device to the backplane.

In another aspect there is provided a method of redirecting current in a current driven device comprising side walls, the method comprising: directing current through a connection pad to the device; and using a metal-insulator-semiconductor to create a field to eliminate leakage current in the side walls.

In another aspect there is provided a method of creating arrays of vertical devices by confining the current in selected areas of a bulk current driven device.

BRIEF DESCRIPTION OF THE FIGURES

The foregoing and other advantages of the disclosure will become apparent upon reading the following detailed description and upon reference to the drawings.

DETAILED DESCRIPTION OF THE INVENTION

Figure 1A:
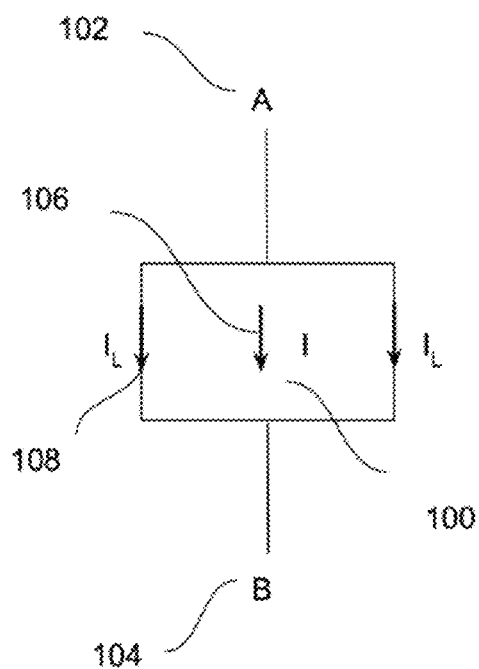
FIG. 1A shows an example of an optoelectronic device with at least two terminals.

Unless defined otherwise, all technical and scientific terms used herein have the same meaning as commonly understood by one of ordinary skill in the art to which this invention belongs.

As used in the specification and claims, the singular forms "a," "an" and "the" include plural references unless the context clearly dictates otherwise.

The term "comprising" as used herein will be understood to mean that the list following is non-exhaustive and may or may not include any other additional suitable items, for example one or more further feature(s), component(s) and/or element(s) as appropriate.

The terms "device" and "microdevice" and "optoelectronic device" are used herein interchangeably. It would be clear to one skill in the art that the embodiments described here are independent of the device size.

The terms "donor substrate" and "temporal substrate" are used herein interchangeably. However, it is clear to one skill in the art that the embodiments described herein are independent of the substrate.

The terms "system substrate" and "receiver substrate" are used herein interchangeably. However, it is clear to one skill in the art that the embodiments described here are independent of substrate type.

The present invention relates to methods for lateral conduction manipulation of vertical solid state devices, particularly optoelectronic devices. More specifically, the present disclosure relates to micro or nano optoelectronic devices in which the performance of the device is being affected by reduction in size. Also described is a method of creating an array of vertical devices by modifying the lateral conduction without isolating the active layers. An array of LEDs using vertical conductivity engineering enables current transport in a horizontal direction and is controlled to the pixel area, so there is no need for patterning the LEDs.

Herein is also described a method of LED structure modification to simplify the integration of monolithic LED devices with backplane circuitry in an LED display while preserving device efficiency and uniformity. The present methods and resulting structures increase the number of LED devices fabricated within a limited wafer area and can result in lower fabrication cost, decrease in the number of fabrication steps, and higher resolution and brightness for the LED displays. LED devices in a substrate can be bonded to an electronic backplane which drives these devices or pixels in passive or active manner. Although the following methods are explained with one type of LED device, they can be easily used with other LED and non-led vertical devices, such as, for example, sensors. LED devices in a substrate as herein described can be bonded to an electronic backplane which drives these devices (pixels) in passive or active manner.

Also described herein is a method of improving the performance of an optoelectronic device by manipulating the internal electrical field of the device. In particular, limiting the lateral current flow of vertical solid state devices can improve the performance of these devices. In particular, diverging current from the perimeter of a vertical device can be accomplished by modifying the lateral conduction. The resistance of the conductive layers can be modified by oxidation, and the lateral resistance of the conductive layers can be modified by modifying the bias condition. A contact can also be used as mask to modify the lateral resistance of the conductive layer. The present devices can also have conductive layers on the sides and functional layers in the middle.

Also provided is a method of pixelating a display device by defining the pixel pad connection in a backplane and attaching the LED device with vertical conduction modulation to the backplane. In one case, the current spreader is removed or its thickness is reduced to modulate the vertical conduction. In another case, some of the microdevice layers are etched to create vertical conduction modulation. A bonding element can be used to hold the device to the backplane. Structures and methods are described for defining microdevices on the device layer by forming contact pads on it before transferring it to a receiver substrate. Also described are structures and methods to define the microdevices by contact pads or bumps on the receiver substrate in an integrated microdevice array system comprising a transferred monolithic array of microdevices and a system substrate.

Also described are methods of manipulating the top conductive layer of a vertical device in which the functionality of the device predominantly is defined by the vertical currents, In one embodiment the method comprises: top layer resistance engineering in which the lateral resistance of the top layer is manipulated by changing the thickness or specific resistivity of this layer; full or partial etching modulation in which the top layer of the vertical device is modulated by any means of etching; and material conductivity modulation in which the resistance of the top layer is modulated by various methods including but not limited to etching, counter doping, and laser ablation. The contact pads on the top device layer can define the size of the individual microdevices. After transfer of microdevices, a common electrode can be deposited on the transferred monolithic array of microdevices to improve the conductivity. The common electrodes can be formed through vias in the top buffer or dielectric layers transferred or deposited on the monolithic array of microdevices. Also, the top layer of the transferred monolithic array of microdevices can be modulated by any means of removing. In this case, optical elements are formed in the removed regions of the modulated top layer.

Also described is a method of forming an array of microdevices on an integrated structure in which the device layer prepared according to aforementioned methods is transferred to a receiving substrate wherein the contact pads on the top of the receiving substrate are bonded to the device layer and the size of the individual microdevices are defined partially by the size of contact pads or bumps on the receiver substrate. Spacers or banks can be formed around contact pads or bumps to fully define the size of the microdevices. The spacers or banks around contact pads or bumps can be adhesives to promote bonding the device layer to the receiver substrate. Here also the top layer of the integrated microdevice array is modulated by any means of removing. In this case, the optical elements can be formed in the removed regions of the modulated top layer.

In an embodiment, at least one metal-insulator-semiconductor (MIS) structure is formed with one of the device faces as semiconductor layer. This structure is used to manipulate the device internal electrical field to control the charge transition and accumulation. The MIS structure can be formed prior to moving the device into the system substrate, or after the device is formed into the system substrate. The electrode in MIS structure can be transparent to let the light pass through, or the electrode can be reflective or opaque to control the direction of the light. Preferably the device output comprises visible light for creating an array of pixels in a display. The electrode in the MIS structure can be shared with one of the devices functional electrode. The electrode in the MIS structure can also have a separate bias point. The input or output of the microdevices can be any form of electromagnetic wave. Non-limiting examples of the device are a light emitting diode and a sensor. Structures and methods for improving micro optoelectronic devices are also described herein. The device performance is improved by means of manipulating the internal electric field. In one case, the MIS structure is used to modulate the internal electrical field.

In microdevice system integration, devices can be fabricated in their native ambient conditions and can be then transferred to a system substrate. To pack more microdevices in a system substrate or reduce the cost of material, the size of microdevices should be as small as possible. In one example, the microdevices are 25 μm or smaller and in another example 5 μm or smaller. As the original devices and layers on the donor substrate are being patterned to smaller area, the leakage and other effects increases reducing the performance of the devices. Although, passivation can improve the performance to some extent, it cannot address other issues such as, for example, non-radiative recombinations.

Various embodiments in accordance with the present structures and processes provided are described below in detail.

Vertical Devices with Metal-Insulator-Semiconductor (MIS) Structures

Described is the use of an MIS structure to modulate the internal electric field of a vertical device to reduce the unwanted effects caused by reduction in the size. In one embodiment, the structure is fully formed on the devices in the donor or temporal substrate substrates and moved to the system substrate afterward. In another case, the MIS structure is formed on the devices integrated on receiver or system substrate. In another case, the MIS structure is formed partially on the devices prior to integration into the receiver substrate and the MIS structure is completed after transferring the device into the receiver substrate.

FIG. 1A shows a microdevice 100 with two functional contacts A 102 and B 104. Biasing the device causes a current 106 through the bulk of the device 100. In case of light emitting devices, the charges recombine in light emitting layer(s) and create photons. In case of sensing devices, the external stimulation (e.g. light, chemical, Tera Hz, X-ray, etc) modulates the current. However, the non-idealities can affect the efficiency of the device 100 in both cases. One example is the leakage current 108 mainly caused by the defects in the side walls. Other non-idealities can be non-radiative recombinations, Auger recombination, charge crowding, charge imbalance, etc. This issues become more dominate as the size of the device is reduced.

Figure 1B:
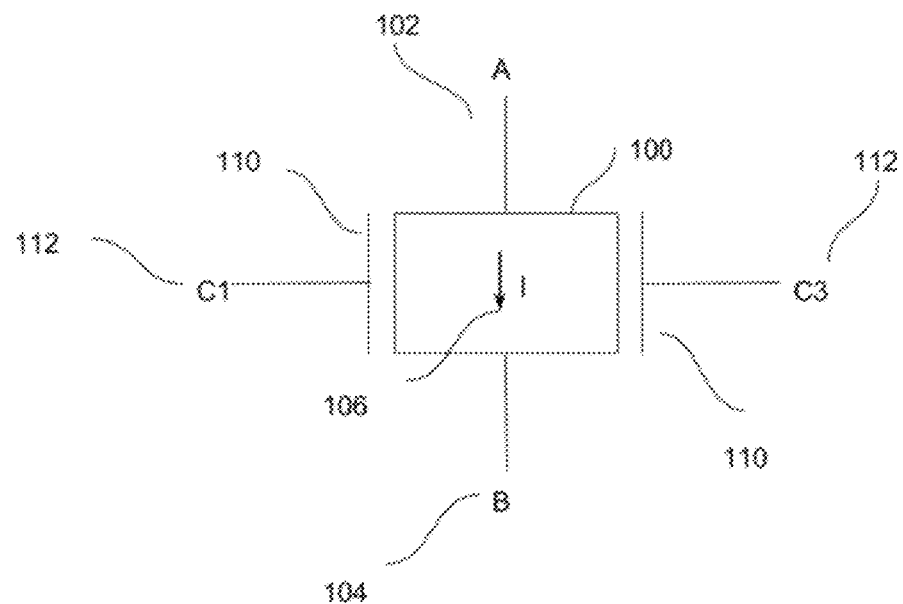
FIG. 1B shows an example of an optoelectronic device with MIS structure on at least one side of the device.

FIG. 1B shows an example of using metal-insulator-semiconductor (MIS) to modulate the internal field to reduces some of these issues. At least one MIS structure 110 is formed on one of the device faces. The MIS structure is biased through an electrode 112. If MIS 110 structure is formed on more than one surface, they can be a continuous structure or few separate MIS structure. The electrodes 112 can be connected to the same biased for all faces or different biases.

Figure 1C:
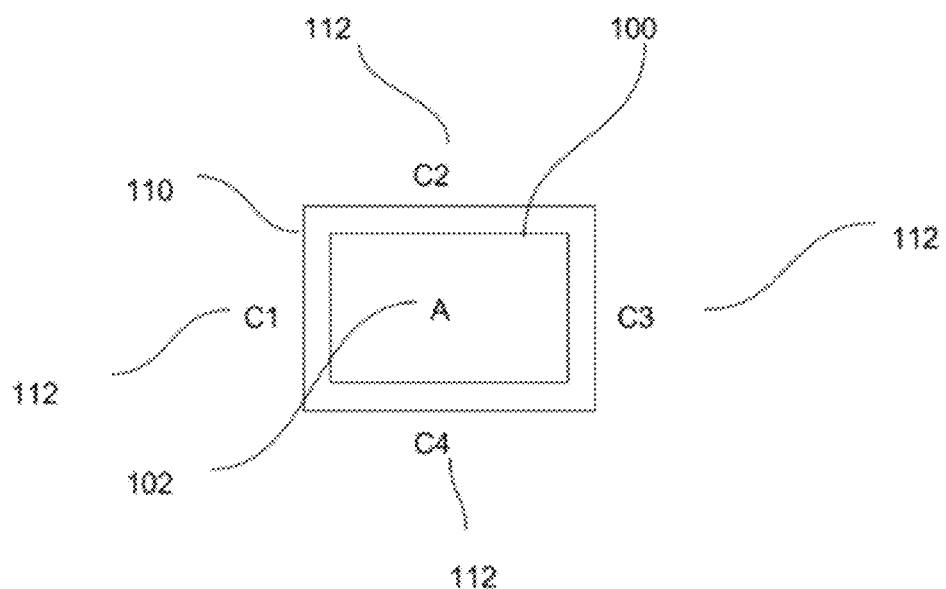
FIG. 1C shows a view through one of the functional electrodes of the device with an MIS structure on the other sides.

FIG. 1C shows a view through one of the functional electrode 102 of the microdevice 100. Here, the MIS structure 110 surrounds the device in one continuous form. Applying bias to the MIS structure can reduce the leakage current 108 and/or avoid band bending under high current density to avoid non-radiative recombinations and/or assists one of the charge to enhance the charge balance and avoid current crowding. The biasing conditions can be chosen to fix the dominant issue. For example, in case of red light emitting diode (LED), leakage current is the major source of efficiency loss at moderate to low current densities. In this case, the biasing condition can block/reduce the leakage current resulting in significant efficiency boost. In another case, such as green LED, Auger recombination can be the main issue. The biasing condition can be adjusted to reduce this type of recombination. It is noted that one bias condition can eliminate/reduces further than one cases. Also, one can dynamically adjust the biasing condition for better performance. For example, in lower current density, one effect (e.g., leakage current) can be dominant effect and at higher current density charge crowding and other issues can be the dominant effect. As such, the bias can be modified accordingly to offer better performance. The bias can be adjusted as a single device or cluster of devices or the entire array of the devices. It can be also different for different devices. For example LED vs sensors, or red vs green LEDs can have different biasing conditions.

Figure 2A:
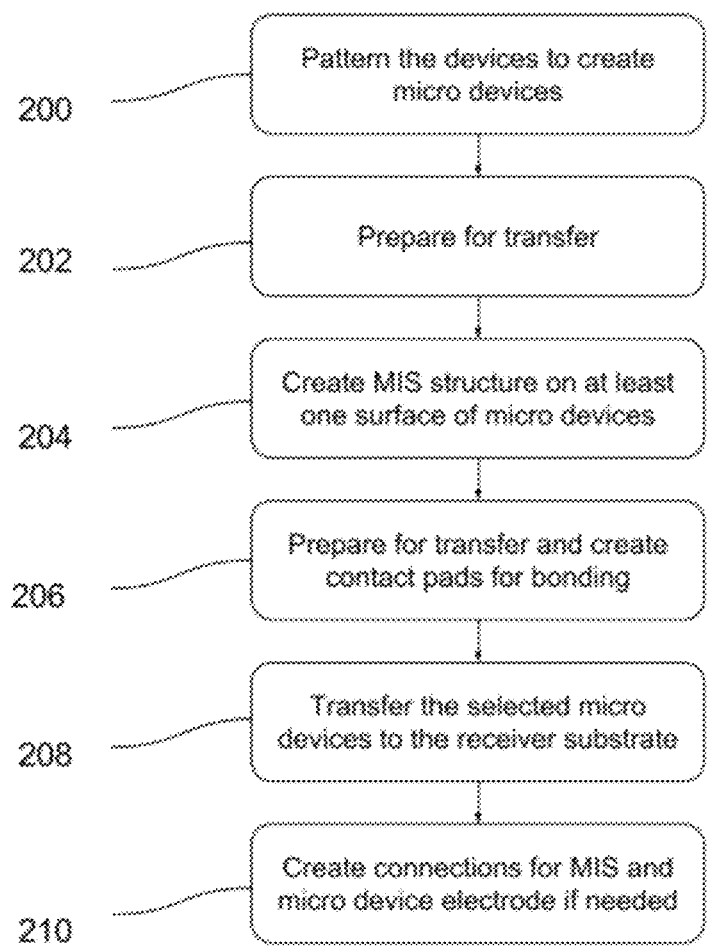
FIG. 2A shows an exemplary embodiment of a process for forming an MIS structure on the device prior to the transfer process.
Figure 2B:
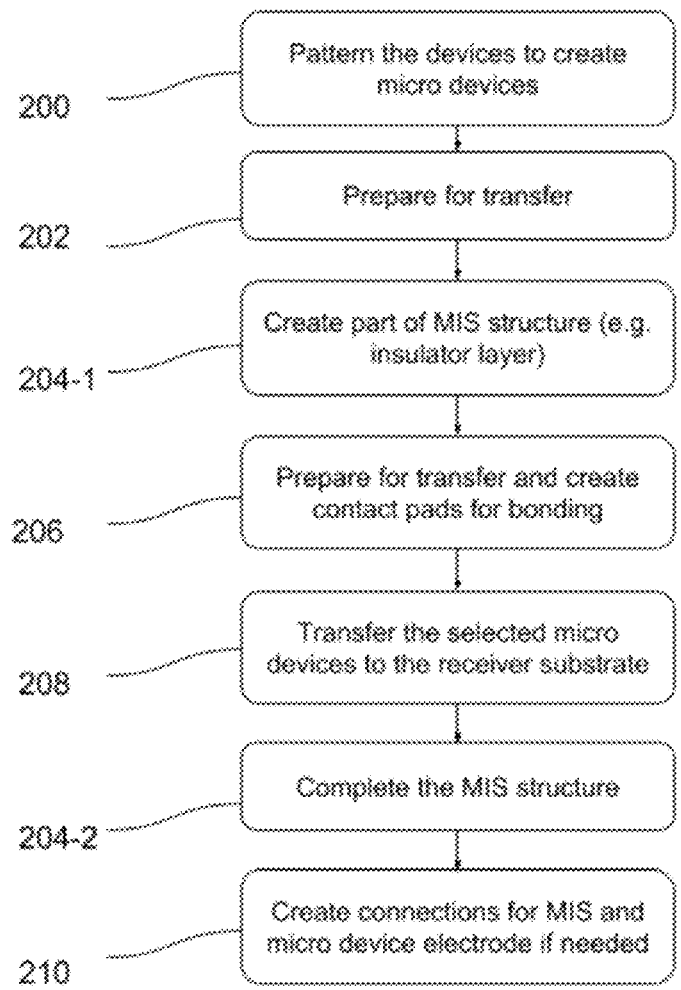
FIG. 2B shows an exemplary embodiment of a process for forming an MIS structure on microdevices both prior to and after the transfer process.
Figure 2C:
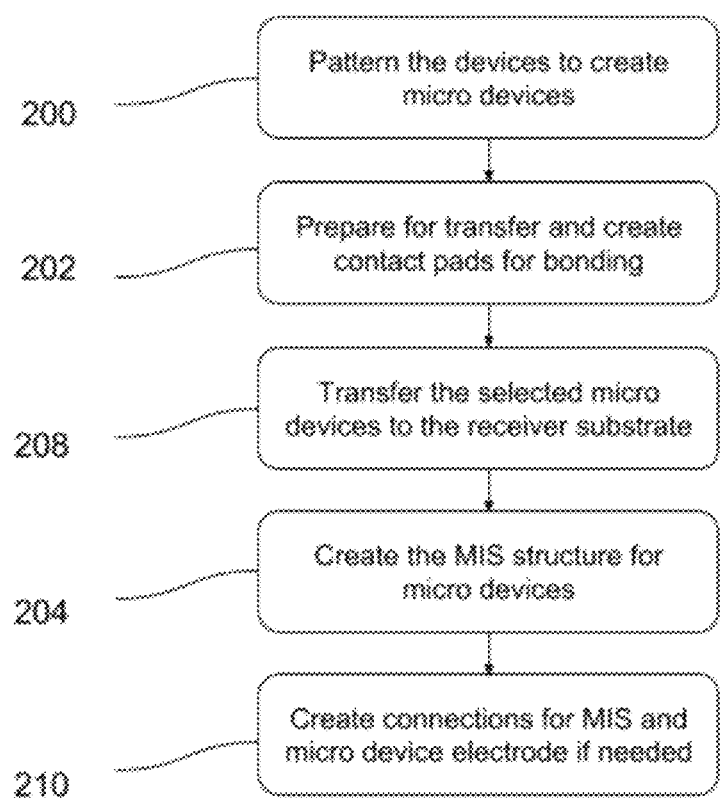
FIG. 2C shows an exemplary embodiment of a process for forming an MIS structure on the device after the transfer process.

A process of forming a MIS structure on a microdevice is described in FIGS. 2A-C. The order of these steps in these processes can be changed without affecting the final results. Also, each step can be combination of few smaller steps.

FIG. 2A shows one example of the process. First the microdevices are formed 200. During this step 200, either the microdevices are formed by patterning or by selective growth. During step 202 the devices are prepared for transfer which can include cleaning or moving to a temporary substrate. During step 204, the MIS structure is formed on one surface of the device. During step 206, device gets ready for transfer which can include lift off process, cleaning process and other steps. In addition during step 206, connection pads or electrodes for device function electrodes or for MIS structure are deposited and/or patterned. During step 208, selected devices are transferred to the receiver substrate. This can be done by various methods including but not limited to pick-and-place or direct transfer. In step 210, connections are formed for the device and MIS structure. In addition, other optical layers and devices may be integrated to the system substrate after the transfer process.

FIG. 2B shows another example of a process of forming a MIS structure on a microdevice. First the microdevices are formed 200. During step 200, either the microdevices are formed by patterning or by selective growth. During step 202, the devices are prepared for transfer which can include cleaning or moving to a temporary substrate. During step 204-1, part of the MIS structure is formed, for example the deposition and patterning of dielectric, on one surface of the device. During step 206, the device gets ready for transfer which can include a lift off process, cleaning process and other steps. In addition during step 206, connection pads or electrodes for device function electrode or for MIS structure are deposited and/or patterned. During step 208, selected devices are transferred to the receiver. This can be done by various methods including but not limited to pick-and-place or direct transfer. The MIS structure is completed during step 204-2, which can include deposition and patterning of a conductive layer. During step 210, connections are formed for the device and MIS structure. Other optical layer and devices may be integrated to the system substrate after the transfer process. Step 210 can be the same as 204-2 or a different and/or separated step. Other process steps may also be done between 204-2 and 210. In one example, a passivation or planarizer layer may be deposited and/or patterned prior to step 210 to avoid shorts between MIS electrodes and other connections.

FIG. 2C shows another example of a process of forming a MIS structure on a microdevice. First the microdevices are formed 200. During this step 200, either the microdevices are formed by patterning or by selective growth. During step 202, the devices are prepared for transfer which can include cleaning or moving to a temporary substrate. During step 206, the device gets ready for transfer which can include lift off process, cleaning process and other steps. In addition during step 206, connection pads or electrodes for device function electrode or for MIS structure are deposited and/or patterned. During step 208, selected devices are transferred to the receiver substrate, which can be done by various methods such as but not limited to pick-and-place or direct transfer. The MIS structure is formed during step 204 which can include deposition and patterning of dielectric and conductive layers. During following step 210, connections are formed for the device and MIS structure. In addition, other optical layer and devices may be integrated to the system substrate after the transfer process. Step 210 can be the share some process with 204 or be completely separated step. In later case, other process steps may be done between 204 and 210. In one example, a passivation or planarized layer may be deposited and/or patterned prior to step 210 to avoid shorts between MIS electrode and other connections.

After patterning the device, depending on the patterning process, the device may have straight or sloped walls. The following descriptions are based on selected sloped cases but similar or modified processing steps can be used for other cases as well. In addition, depending on the transfer method, the device face connected to receiver substrate may vary and so affect the slope of the device wall. The processing steps next described can be used directly or modified to be used with other slopes and device structures.

Figure 3:
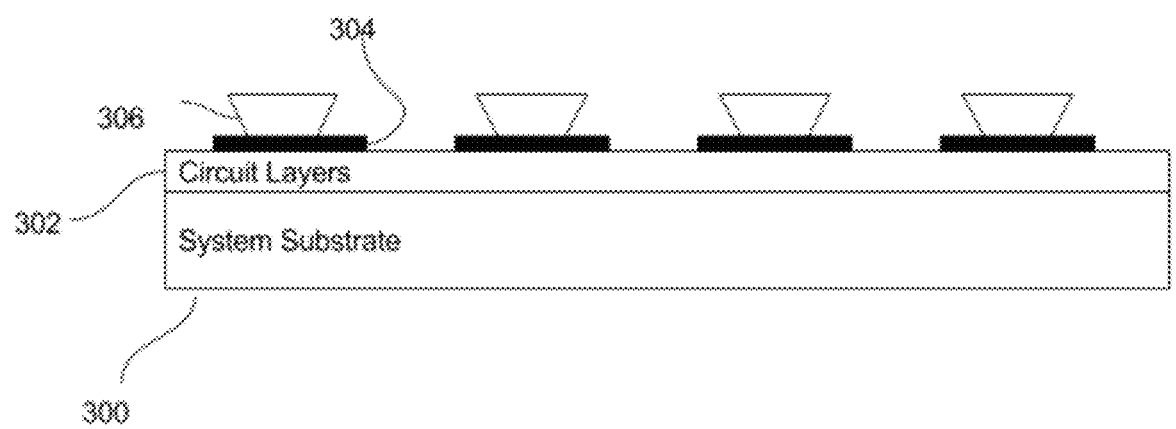
FIG. 3 shows a transferred microdevice with a negative slope on a system substrate.

FIG. 3 shows microdevices 306 transferred to the system or receiver substrate 300 with negative slope. The devices 306 are connected to circuit layer 302 through at least one contact pads 304. Here, depending on the slope of the process, one can either use normal deposition or polymer for creating MIS structure. The methods described here can be used with some modifications or directly for this case. However, if the slope is too wide, the preferred way is to prepare the MIS structure on the devices prior to transfer. An exemplary method for creating MIS structure prior to transfer will be described later.

Figure 4A:
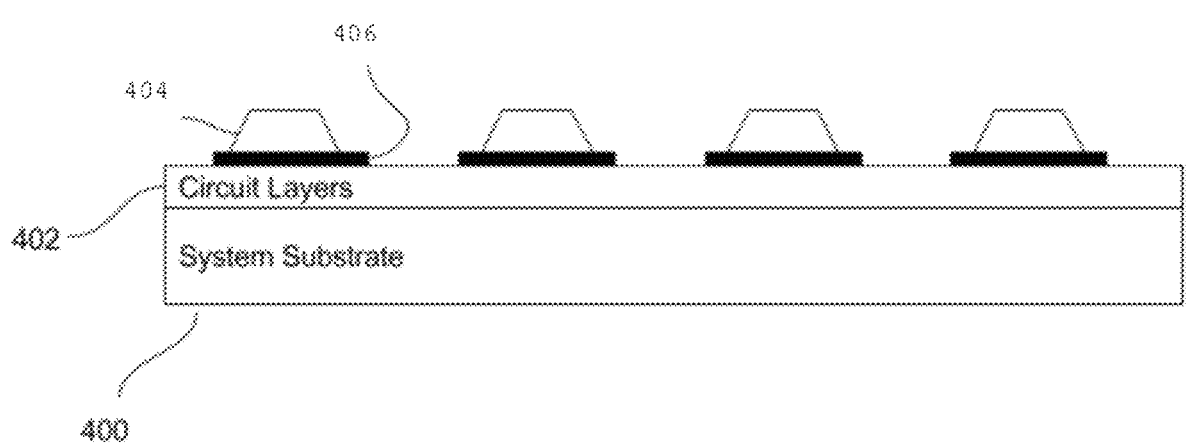
FIG. 4A shows a transferred device with a positive slope on the system substrate.

FIG. 4A shows an embodiment of a MIS structure in accordance with method 1000. This can also be a straight wall device. FIG. 4A shows the microdevice 404 after transferred to the system substrate 400 and connected to circuit layer 402 through at least one connection pad 406. After this phase, one can create or complete the MIS structure. While traditional lithography, deposition and patterning processes are applicable for creating or completing such structure and connecting it to proper bias connections, different methods can be used with further tolerance to misplacement of the microdevices 404. Specially, in large area processes, the microdevice placement inaccuracy may be a few micrometers.

Figure 4B:
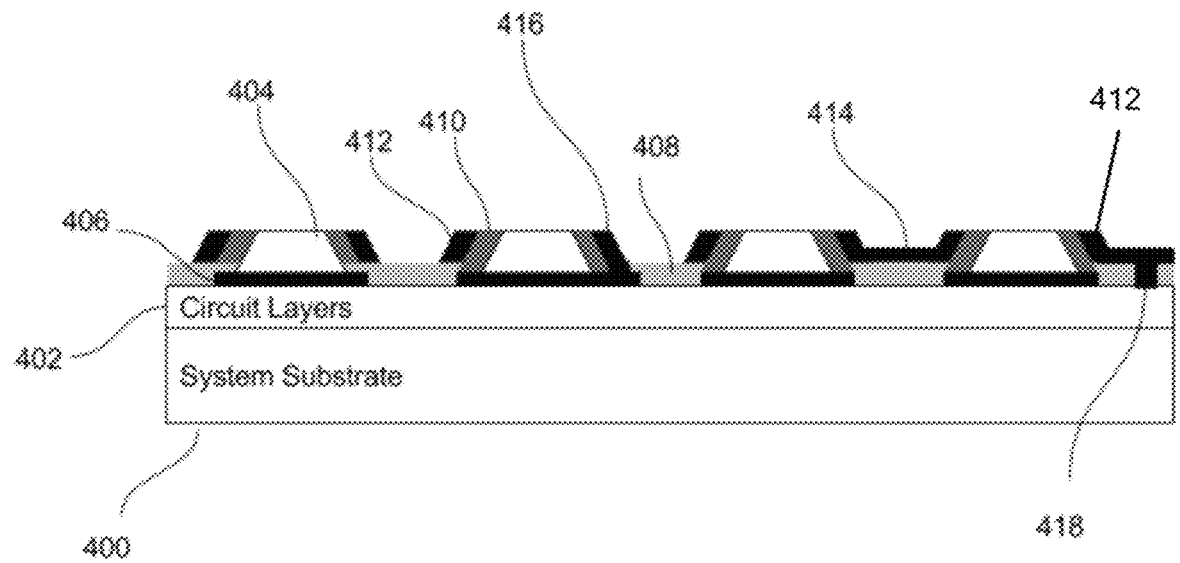
FIG. 4B shows formation of different MIS structures on transferred microdevices.

FIG. 4B shows different structures that can be formed in accordance with the MIS structure 110. In one case, a dielectric layer 408 is deposited to cover exposed unwanted contact pads 406. Vias 418 can be opened in the dielectric layer 408 for connecting the MIS to the circuit layer 402. Also, a similar or different dielectric 410 can be deposited on at least one side of the microdevice 404 to as part of the MIS structure. This step can be also done prior to transferring the device to the system substrate 400. After that a conductive layer 412 completing the MIS structure is deposited and patterned. In one case, an extension 414 of the conductive layer 412 connects at least two MIS structures together. In another case, a connector 416 of the conductive layer 412 connects MIS structure to at least one of the contact pads 406 of the microdevice 404. The conductive layer 412 can be transparent to allow other optical structures to be integrated into the system substrate 400 or it can be reflective to assist light extraction or absorption. It can also be opaque for some applications. Further processing steps can be carried out after formation of the MIS structure such as but not limited to depositing common electrode, integration of optical structure/devices.

Figure 4C:
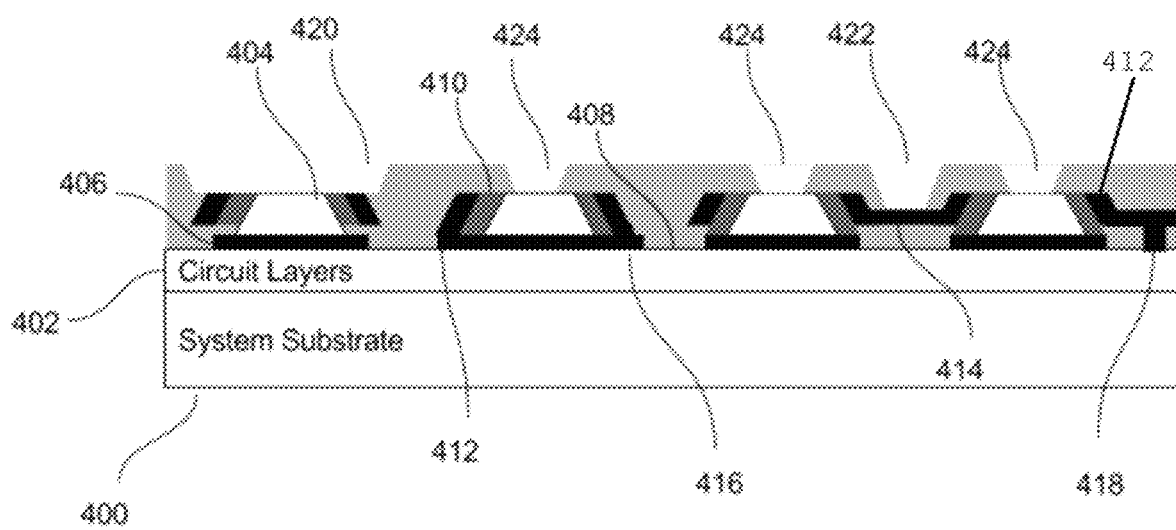
FIG. 4C shows formation of a passivation or planarization layer and patterning it for creating opening for electrode connections.

FIG. 4C shows an exemplary structure comprising a system substrate for common electrode deposition. Here, the surface is planarized and patterned to provide access points for connection. The common electrode 426 can coupled to either the microdevice, MIS structure or circuit layer through the patterning 420, 422, 424.

Figure 4D:
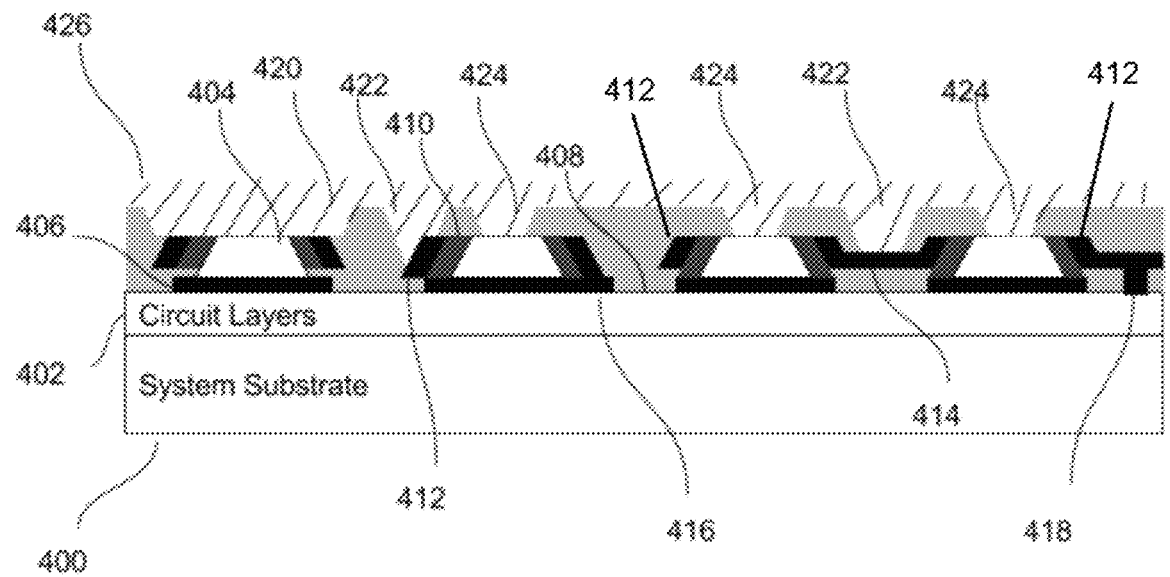
FIG. 4D shows deposition of electrodes on the devices.

FIG. 4D shows an exemplary of a common electrode 426. This electrode 426 can be patterned to create addressable lines. It can be transparent, reflective or opaque. Several other methods can be used for deposition of common electrode 426. Also other optical devices and structures can be integrated before or after the electrode.

Figure 5A:
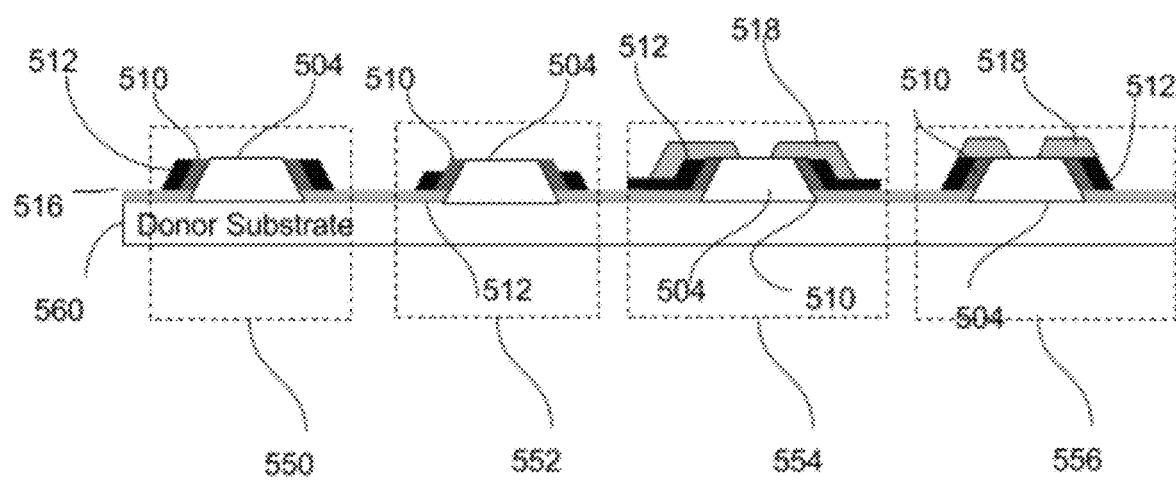
FIG. 5A shows embodiments for formation of different MIS structures on devices before the transfer process.

FIG. 5A demonstrates a process of forming part or most of the MIS structure on donor (or intermediate or original) substrate 560 prior to transferring them to system substrate 500. This process can be done at the original substrate used for fabrication of the device or on any intermediate substrate. FIG. 5A demonstrates different MIS structures that can be formed on the devices. Other structure can also be used. A dielectric layer 516 can be deposited prior to the formation of the MIS structure. This may avoid any unwanted short/coupling between MIS and other contacts after transfer. The MIS structure is formed by conductive layer 512 and dielectric layer 510. The dielectric layer can be similar to dielectric 516 or different. It can be also stack of different dielectric layer. In structure 550 and 552, no dielectric is deposited on top of conductive layer 512. In structure 552, conductive layer 512 is recessed from the edge of device to avoid any short. It is possible to have the conductive layer 512 covering the edge of the device 504 as well. In structure 554, conductive layer 512 is extended to create easier access for creating connection after transferring to system substrate. In addition, the device is covered with a dielectric layer 518 with opening for connection to microdevice 504 and extended electrode. Structure 556 uses dielectric 518 for covering the top side of the microdevice 504.

Figure 5B:
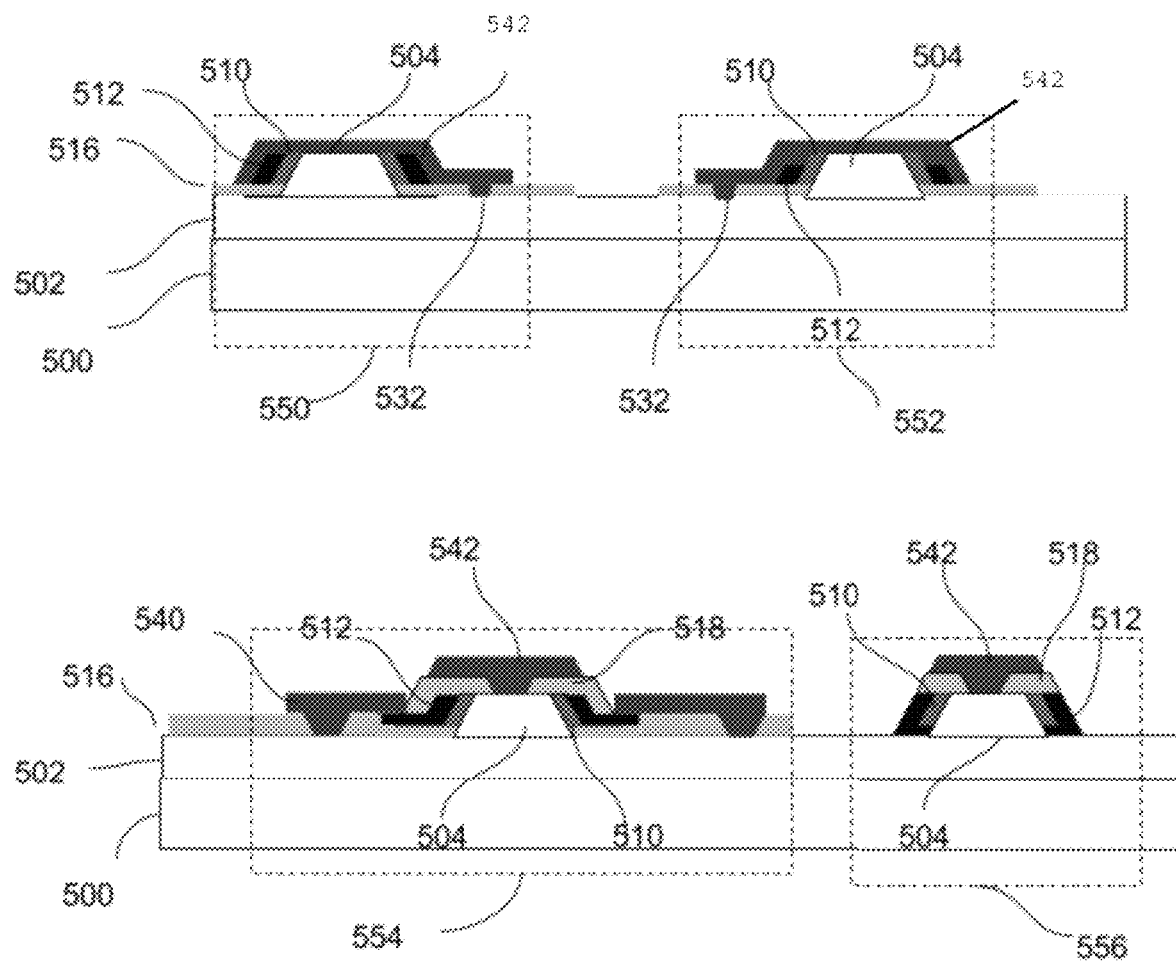
FIG. 5B shows devices with an MIS structure transferred into a system substrate and different methods for coupling the devices and MIS to electrodes or circuit layer.

FIG. 5B shows the microdevices 504 with MIS after being transferred to the system substrate 500. During the transfer process, the devices are flipped so that the surface connected to donor substrate 560 is also connected to the system substrate 500. There can be a connection pad between microdevice 504 and system substrate 500 to couple the device to the circuit layer 502. Different methods can be used including the one described above to create connection for the MIS and the other electrode (e.g. common electrode). Another method is shown here for structures 550 and 552, which include a top electrode 542. The electrode 542 covers both the microdevice 504 and the conductive layer 512 of the MIS structure. The electrode 541 can be connected to the circuit layer 502 with via 532 or it can be connected at the edge of the system substrate 500 through bonding. In structure 554, a conductive layer 540 is used to couple the MIS structure to the circuit layer 502. One can extend the dielectric layer 516 on the system substrate 500 to cover the connection pads between microdevice 504 and the system substrate 500 avoiding possible short between the MIS and other connections. In the case of 556, the MIS can be short to the device contact pads or it can be aligned properly to have its own contact on the system substrate 500. For both 554 and 556, one can use different post processing steps similar to other structures in this patent. One example can be a common electrode deposition with or without planarization. Another example can be light confinement structure or other optical structure.

Figure 6A:
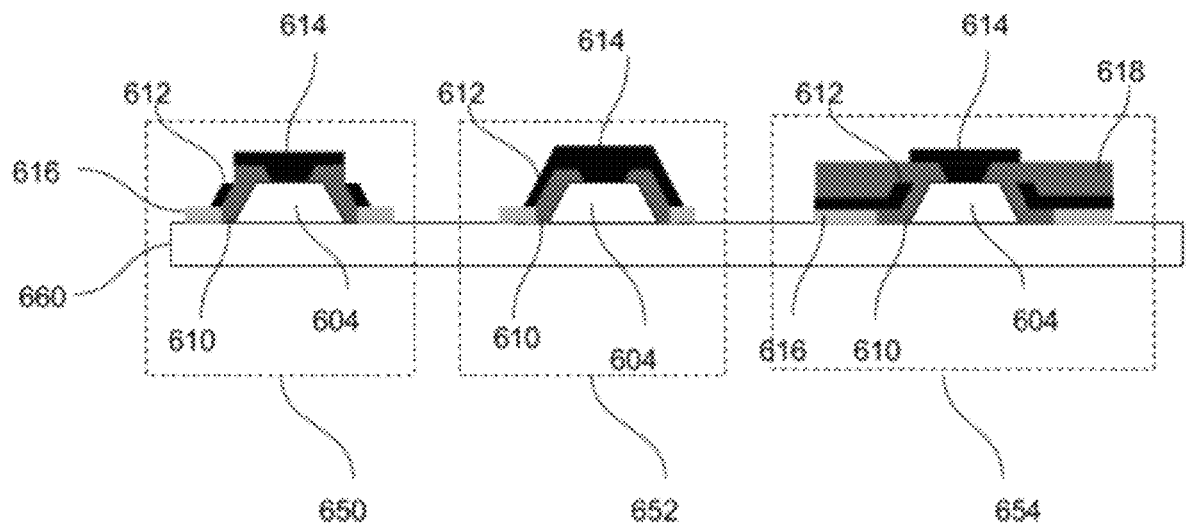
FIG. 6A shows another embodiment for formation of different MIS structures on devices before the transfer process.

FIG. 6A demonstrates a process of forming part or most of the MIS structure on a donor (or intermediate or original) substrate 660 prior to transferring them to system substrate 600. This process can be done at the original substrate used for fabrication of the device or on any intermediate substrate. FIG. 6A demonstrates different MIS structures that can be formed on the devices. It is obvious to skill person that other structure can be used as well. A dielectric layer 616 can be deposited prior to the formation of the MIS structure. This will avoid any unwanted short/coupling between the MIS structure and other contacts after transfer. The MIS structure is formed by a conductive layer 612 and a dielectric layer 610. The dielectric layer 610 can be similar to dielectric layer 616 or different. The dielectric layer 610 can also be a stack of different dielectric layers. In addition, a connection pad 614 is formed on the microdevice 604. In structure 650 and 652, no dielectric is deposited on top of the conductive layer 612. In structure 652, the conductive layer 612 is the same as the contact pad 614. It is possible to have the conductive layer 612 covering the edge of the device 604 as well. In structure 654, the conductive layer 612 is extended to create easier access for creating connection after transferring to system substrate 600. In addition, the microdevice 604 is covered with a dielectric layer 618 with an opening for connection to the microdevice 604 and extended electrode 614.

Figure 6B:
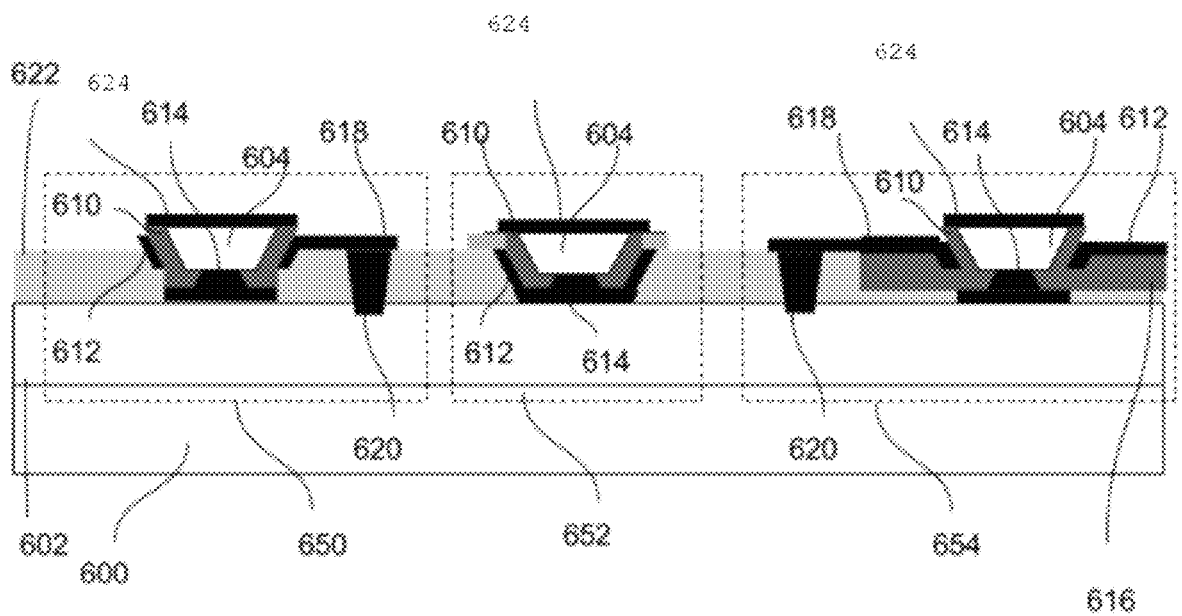
FIG. 6B shows devices with an MIS structure transferred into system substrate and different methods for coupling the devices and MIS to electrodes or circuit layer.

FIG. 6B shows the microdevices 604 with the MIS structure after being transferred to the system substrate 600. There can be a connection pad 614 between the microdevice 604 and the system substrate 600 to couple the device 604 to the circuit layer 602. One can use different methods including the ones described above to create connection for the MIS structure and the other electrode (e.g., common electrode). Another method shown here for structure 650 and 654. Here, the negative slope of the device 604 is used to create connection between the MIS structure and the system substrate 600 through an electrode 618 and a via 620. A passivation layer or planarization layer 622 can be deposited prior to the electrode 618 deposition and patterning. The microdevice 604 can be covered during electrode deposition or the conductive layer 612 can be removed from its top by patterning and etching. However, using the negative slope for separating the top electrode 624 of the microdevice 604 and the MIS electrode 618, is preferred since it is more immune to misalignment which is crucial for high throughput placement of the microdevices 604. For all structures, one can use different post processing steps similar to other structures in this patent. One example can be a common electrode deposition with or without planarization. Another example can be light confinement structure or other optical structure.

The methods described here can be used for different structures and these methods are just few examples can be modified without affecting the outcome. In one example, the electrodes and conductive layers can be either transparent, reflective or opaque. Different processing steps can be added between each step to improve the device or integrate different structure into the device without affecting the outcome of creating the MIS structure.

Vertical Devices with Conductivity Modulation Engineering

Figure 7A:
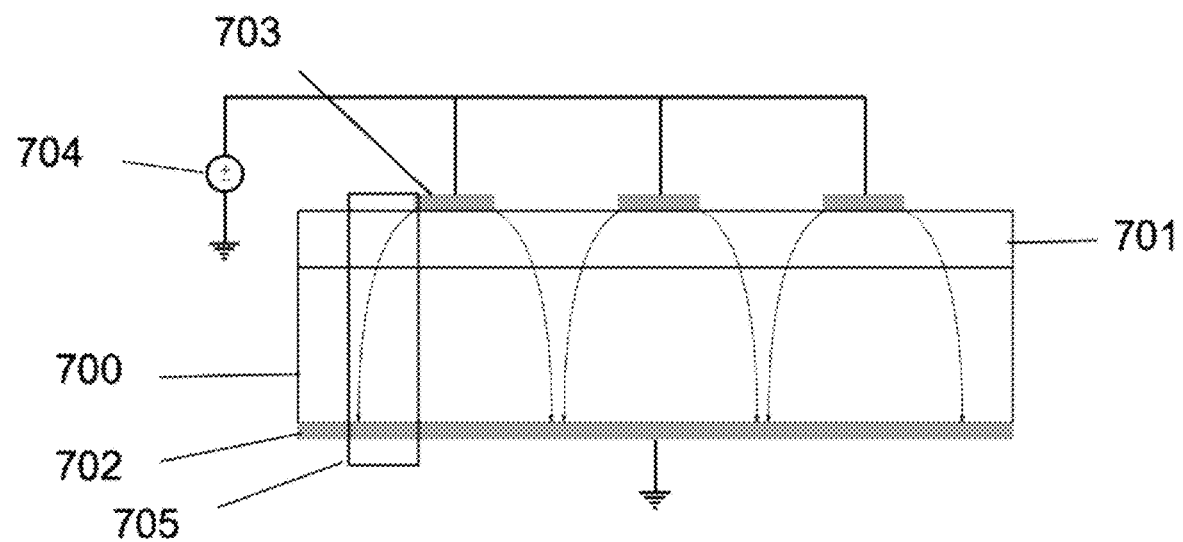
FIG. 7A shows a schematic of a vertical solid state device showing the lateral current components and partially etched top layer.

FIG. 7A shows a vertical solid state device schematic showing lateral current components and partially etched top layer capable of directing current through the bulk of the device. In FIG. 7A the device layer 701 is formed on the device substrate 700. Contact pads 703 are formed on the device layer 701 and they are derived by, for example, a voltage source 704 connected to the contact pads 703 and common electrode 702. The functionality of device layer 701 is predominantly defined by the vertical current. However, due to the top surface lateral conduction of the device layer, current 705 with lateral components flow between contact pads 703 and common electrode 702. Still referring to FIG. 7A, in order to reduce or eliminate the lateral current flow 705, the following techniques are suggested:

1. Top layer resistance engineering
 2. Fully/Partial etching modulation
 3. Material conductivity modulation In this way, the lateral current flow structure can be divided into three main structures: at least one conductive layer with resistance engineering, a full or partial etching of one or more conductive layers, and a material for conductivity modulation. The conductive layer with resistance engineering can be described as follows. The semiconducting top layer of the vertical device 701, just before the metallic contact 703, can be engineered to limit the lateral current flow by manipulating the conductivity or thickness of the conductive layer. In one embodiment, when the top layer is a doped semiconducting layer, decreasing the concentration of active dopants and/or the thickness of this layer can significantly limit the lateral current flows. Also, the contact area can be defined to limit the lateral conduction. In another case, the thickness of the conductive layer (or more than one conductive layers) can be reduced. After that the contact layer is deposited and patterned. This can be done on an array device or non-isolated device. As a result, the active layers are not etched or separated to create individual devices, therefore, no defect is created at the perimeter of the isolated devices since the isolation is developed electrically by controlling the current flow. Similar techniques can be used on isolated devices to diverge the current from the perimeter of the device. In another case, after the device is transferred to another substrate, the other conductive layer or layers are exposed. The thickness of this layer may be chosen to be high to improve device fabrication. After the conductive layer is exposed, the thickness can be reduced or the dopant density decreased, however some of the conductive layers may have also blocking role for the opposite charge. As a result, removing some of the conductive layers to thin the total conductive layer resistance may reduce the device performance. However, it can be very efficient on single layer engineering.

Figure 7B:
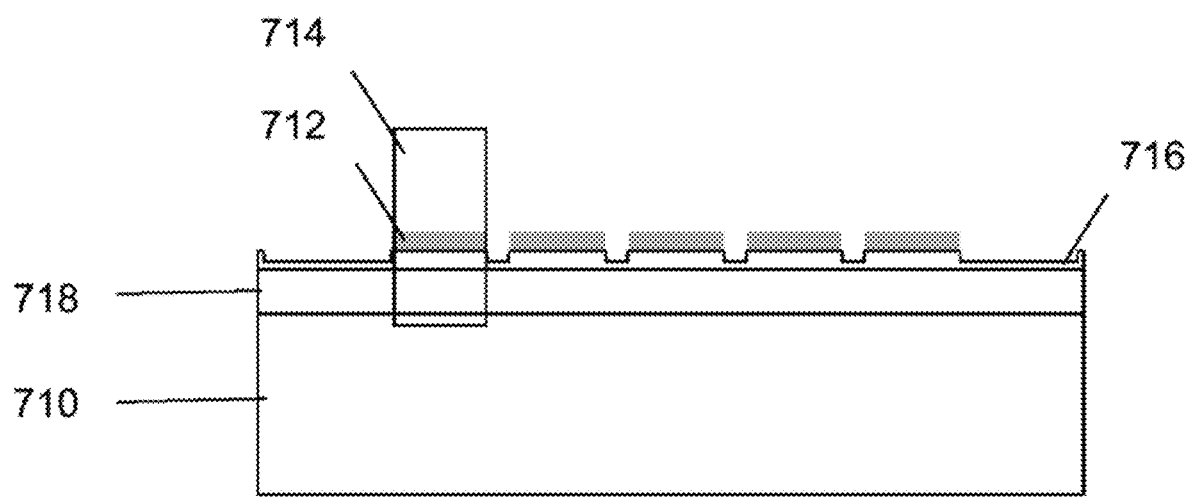
FIG. 7B shows a schematic of a device with partially etched top layer and top layer modulation.

FIG. 7B is a schematic of a device with partially etched top layer. In this case the top conductive layer is for example a p-or-n-doped layer in a diode. The material for conductivity modulation directs current through the bulk of vertical solid state device. At least one of the conductive layers in the device can be etched fully or partially. Referring to FIG. 7B, the top layer 716 below top contact 712 and on top of the device layer 718 can be fully or partially etched to eliminate or limit the lateral current flow in these devices. Here, the microdevice 714 is defined by the size of contact pad 712. This is especially beneficial for devices where the top layer resistance manipulation will adversely affect the device performance. Here, the layer thickness between adjacent devices is reduced to make a higher resistance for the current to flow in the lateral direction. An etching process can be done using, for example, dry etching, wet etching or laser ablation. Here, in many cases, the top metallic contact 712 may be used as the mask for the etching step. In case of full etching, the etching can stop at the function layer. In one embodiment, the contact layer deposited on top of the conductive layer can be used as the mask for etching the conductive layer or layers, potentially enabling fewer processing steps and a self-aligned structure. This is especially beneficial for devices where the conductive layer resistance manipulation will adversely affect the vertical device performance. Here, the conductive layer thickness is reduced in selected area to make a higher resistance for the current to flow in the lateral direction. After the bottom conductive layers are exposed either by transfer mechanism or etching of substrate, the same etching process can be performed. Here also, the contact can be used as the mask for etching the device.

Figure 7C:
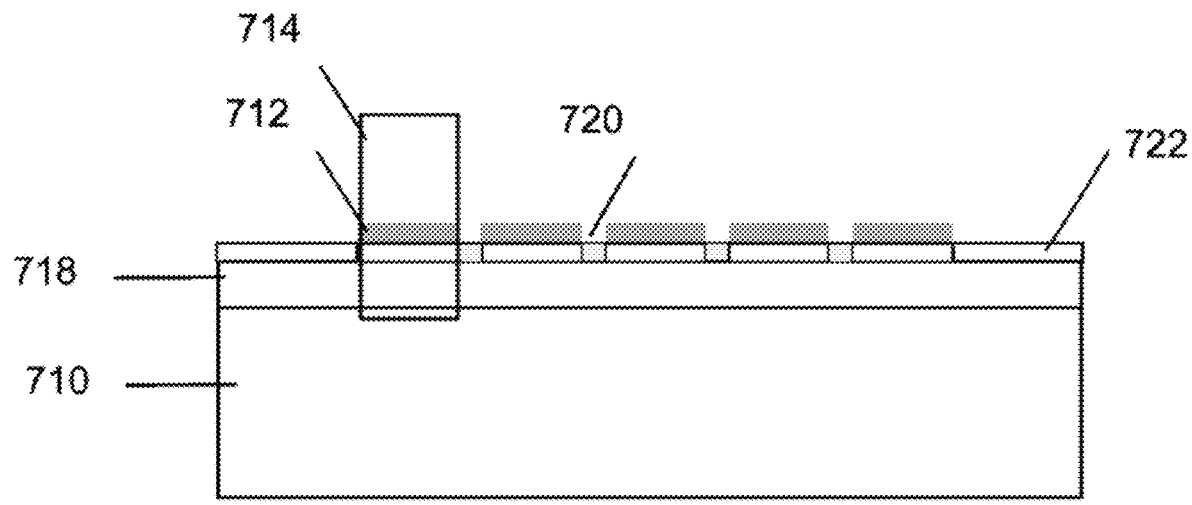
FIG. 7C shows a schematic of a vertical device with a top conductive modulation layer.

FIG. 7C is a schematic of a vertical device with a top conductive modulation layer and device layer 718. As shown, the resistance of an area 720 of the conductive top layer 722 between adjacent contact pads 712 is manipulated to limit the lateral current flow components. Counter doping and laser ablation modulation are examples of processes that can be used in this embodiment. Similar to the full/partial modulation scheme, in this embodiment the top contact can be used as the mask for the modulation step. In one case, oxidation can be used. In one method, photoresist is patterned to match the oxidation area, then the devices are exposed to oxygen or other chemical oxidant to oxidize the area. Then the contact is deposited and patterned. In another method, the contact is deposited and patterned first, then the contact is used as mask for oxidation. The oxidation step can be done on isolated devices or non-isolated devices. In another embodiment, prior to oxidation, the total thickness of the conductive layer(s) can be reduced. This can be done on a selected area for oxidation only. In another case, the oxidation can be done on the walls of the device, which is especially applicable for isolated devices. Also, the bottom layer can be modulated similarly after being exposed. In another method, the material conductivity modulation can be done through electrical biasing. Here the bias for the area that require high resistance is modified. In one case, the bias modulation can be done through an MIS (metal-insulator-semiconductor) structure, and the metal layer can be replaced with any other conductive material. For example, to prevent the current from the contact from going further away from the contact laterally, an MIS structure is formed around the contact. This MIS structure can be formed before or after the contact is in place. In all above mentioned cases, the active device area is defined by the top contact pads formed on the device layer.

Figure 7D:
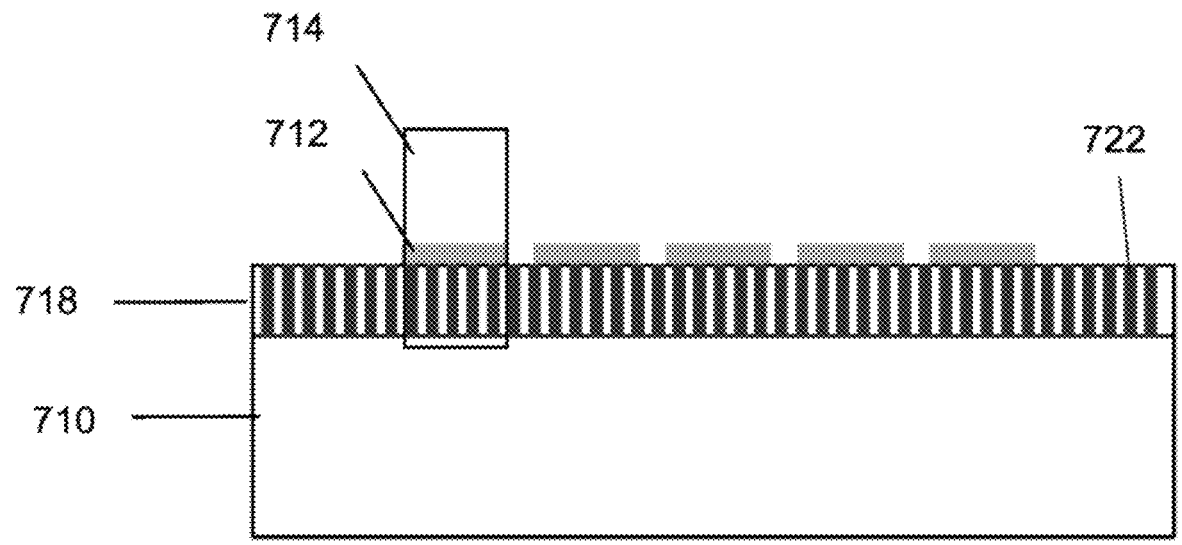
FIG. 7D shows the schematic of a device layer with nanowire structures.

The definition of the active device area by the top contact pad may be more readily applied to devices with pillar structures. FIG. 7D shows a cross section of the MIS structure surrounding a single contact layer, however it is understood that the same can be done for more than one contact layer. The device layer 718 is a monolithic layer consist of pillar structures 722. Because the pillar structures 722 are not connected laterally, no lateral current component exist in the device layer 718. One example of these devices is nanowire LEDs where the LED device consists of several nanowire LED structures fabricated on a common substrate. In this case, as it is shown in FIG. 7D, the top metallic contact defines the active area of the LED structure. Device layers with no lateral conduction is not limited to pillar structures and may be extended to device layers with separated active regions such as layers with embedded nano or micro spheres or other forms.

Figure 7E:
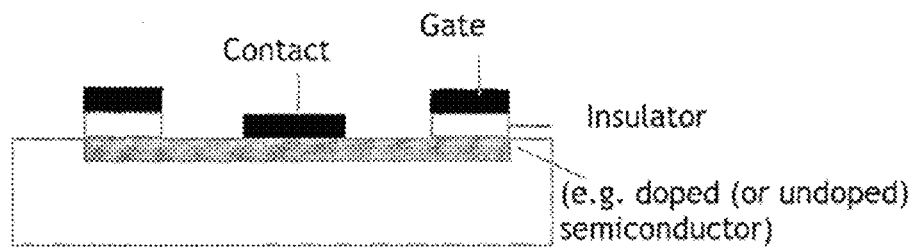
FIG. 7E shows a cross section of the MIS structure surrounding a contact layer.

FIG. 7E shows a cross section of the MIS structure surrounding a contact layer. By biasing the conductive layer of the MIS structure to off voltage, limited or no current will pass the structure laterally. The MIS structure can be formed on the device or can be part of the transferred substrate, and the MIS structure defines the direction of lateral conduction. Other configurations are conceivable, such as the conductive layer can extend to both sides of MIS structure such that the dielectric can extend over other conductive layers. Also the MIS structure can be an open or closed structure, or alternatively continuous or a one piece structure. In another embodiment, the dielectric can comprise the oxidation layers from a photoresist or masking step. Also another dielectric can be deposited on top of the oxidation layer, or a deposited dielectric can be used by itself. In another embodiment, the conductive layer(s) can be removed so that the dielectric is in contact with a semiconductor layer. The MIS structure can also be formed on the walls of the device for further deterring current from travelling to the edge of the device. The device surface can also be covered by dielectric. For example, a gate conductive layer can be deposited and patterned for a gate electrode, then a dielectric can be patterned using the gate electrode as a mask. In another method, the dielectric which is an insulator is patterned first, and then the gate is deposited. The gate and contact can be patterned at the same time or can be done separately. A similar MIS structure can also be made on the other side after it is exposed. The thickness of conductive layers of the device can be reduced to improve the effectiveness of MIS. Where selective etching or modulation of conductive layer on either side of vertical device is difficult, the MIS method can be more practical, in particular if etching or resistance modulation may damage the active layer. In the described vertical structures, the active device area is defined by the top contact area.

Method for Manufacturing LED Displays

Methods for manufacturing LED displays are described using LED devices grown on a common sapphire substrate.

A light emitting diode structure and its manufacturing method for LED displays is disclosed. The LED comprises a substrate, a first doped layer (e.g., n-type layer), active layers and, another doped conductive layer (e.g., p-type layer) formed on the substrate. The following is described with reference to a Gallium Nitride-based (GaN) LED, however the presently described vertical device structure can be used for any type of LEDs with different material systems.

Figure 8A:
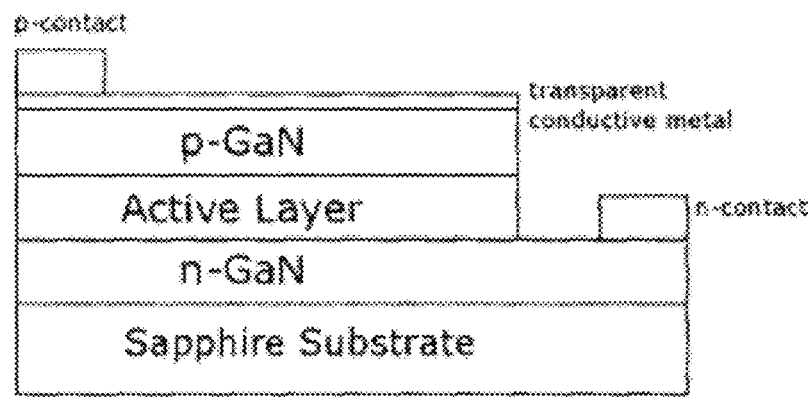
FIG. 8A schematically illustrates a conventional Gallium nitride (GaN) LED device.

In general, GaN LEDs are fabricated by depositing a stack of material on a sapphire substrate. FIG. 8A schematically illustrates a conventional GaN LED device which includes a substrate, such as sapphire, an n-type GaN layer formed on the substrate or a buffer layer (for example GaN), an active layer such as multiple quantum well (MQW) layer and a p-type GaN layer. A transparent conductive layer such as Ni/Au or ITO is usually formed on the p-doped GaN layer for a better lateral current conduction. Conventionally, the p-type electrode such as Pd/Au, Pt or Ni/Au is then formed on the transparent conductive layer. Because the substrate (Sapphire) is an insulator, the n-type GaN is exposed to make contact to this layer. This step is usually done using a dry-etch process to expose the n-type GaN and then deposit the appropriate metal contacts. In LED display applications where display pixels are single device LEDs, each LED is bonded to a driving circuit which controls the current flowing into the LED device. Here, the driving circuit may be a thin film transistor (TFT) backplane conventionally used in LCD or organic light-emitting diode (OLED) display panels. Due to the typical pixel sizes (10-50 μm), the bonding may be performed at a wafer level scale. In this scheme, an LED wafer consists of isolated individual LED devices are aligned and bonded to a back-plane which is compatible with LED wafer in terms of pixel sizes and pixel pitches. Here, the LED wafer substrate may be removed using various processes such as laser lift-off or etching.

Figure 8B:
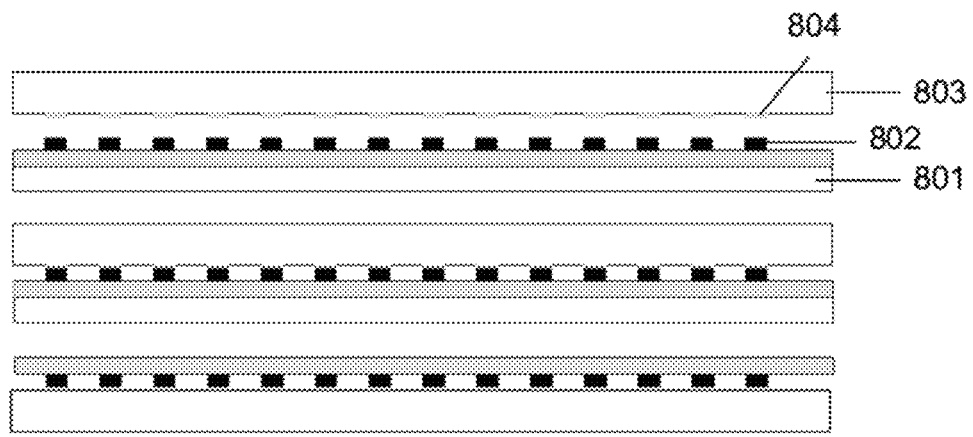
FIG. 8B illustrates a fabrication process of an LED display and integration process of a device substrate with microdevices defined by top contacts and bonding of the substrate to a system substrate.

FIG. 8B illustrates a fabrication process of an LED display and shows the integration process of a device substrate with microdevices defined by top contacts 802 and bonding of this substrate to a system substrate. Microdevices are defined using the top contact 801 formed on top of the device layer may be bonded and transferred to a system substrate 803 with contact pads 804. For example, the microdevices may be micro LEDs with sizes defined by the area of their top contact using any methods explained above. The system substrate may be a backplane with transistor circuitry to drive individual micro-LEDs. In this process, the LED devices are isolated by dry etching and passivation layers. Full isolation of the devices can create defects in the active or functional layers, reducing the efficiency and imposing non-uniformities. Since the perimeter to area of the microdevices is more substantial as the device becomes smaller, the effect of defects become more noticeable. In one embodiment, a monolithic LED device is converted into individual micro-LEDs without etching the active area and using lateral conductive manipulation. As a result, there is no side wall within the micro-LED to create defects. The surrounding walls across the array of LEDs can be thereby be extended until they have no effect on the peripheral LED devices. Alternatively, a set of dummy LED devices around the array can be used to reduce the effect of the peripheral walls on the active micro-LED devices. This technique can also be used to prevent or reduce the current going through the side walls.

Figure 8C:
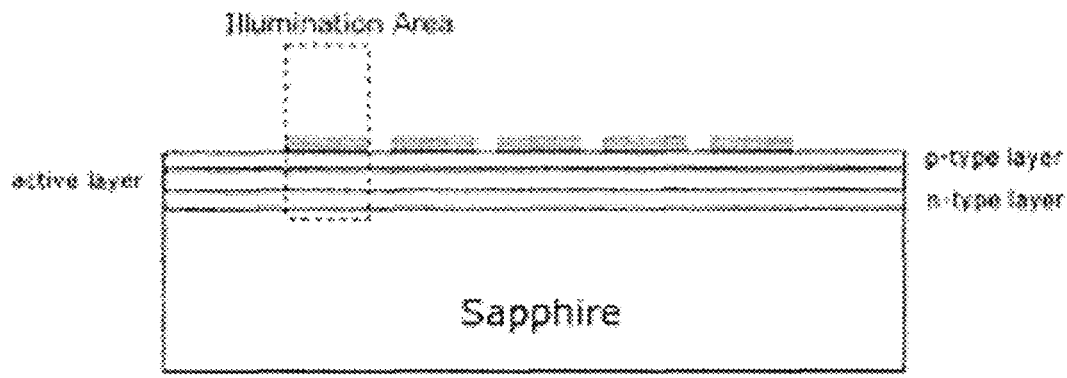
FIG. 8C illustrates an LED wafer structure defined by the top contact.

In another embodiment, the LED wafer can be fabricated such that the p-type layer is the top layer, as shown in FIG. 8C. The p-type layer thickness and conductivity can be manipulated to control the lateral conduction through the device. This may be done by either etching of the pre-deposited p-layer or by depositing a thinner p-layer during the LED structure fabrication. For the etching method, accurate thickness control can be achieved using a dry etching process. In addition, the material structure of the p-layer can be modified by layer doping level to increase the layer's lateral resistance. The top layer does not have to be limited to the p-layer and can be extended to other top layers in the LED structure. As a result of this modification, the illumination area can be defined solely by the deposited conductive layer area on top of the p-type film.

Figure 8D:
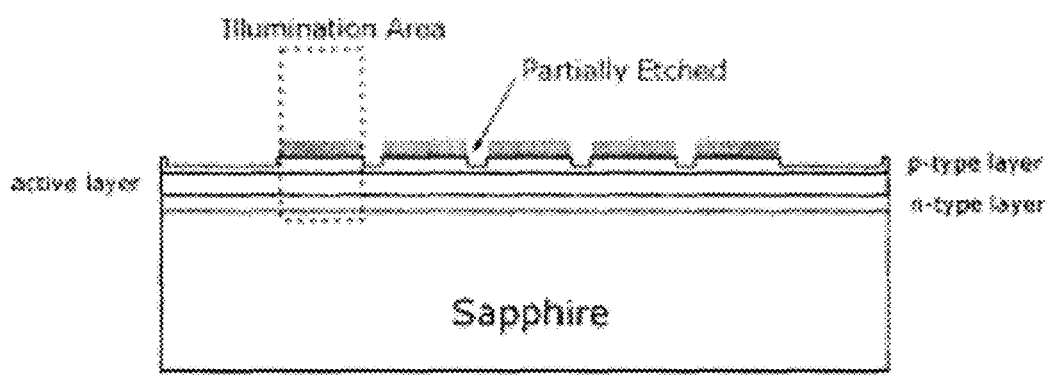
FIG. 8D illustrates an LED wafer structure defined by the top contact and partially etched p-layer.

In another embodiment shown in FIG. 8D, to further limit the lateral illumination, the p-layer between two adjacent pixels can be fully or partially etched. This process step may be done after the conductive layer deposition in a process such as dry etching. In this case, the conductive layer may be used as a mask. Preferably the present structures limit or eliminate the wall passivation of pixels which results in higher number of pixels in a specific area of the wafer or higher pixels per inch (PPI). This may also be translated to fewer process steps and lower fabrication cost compared to fully isolated LEDs with wall passivation.

Figure 8E:
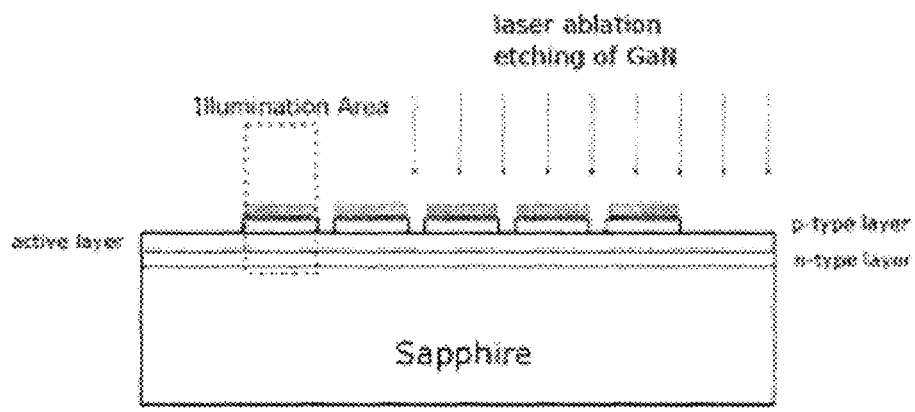
FIG. 8E illustrates an LED wafer structure defined by the top contact and laser etching of p-layer.

In another example, FIG. 8E illustrates an LED wafer structure defined by the top contact and laser etching of p-layer. Here, the top layer, p-type layer, may be partially or fully removed using laser ablation etching of GaN. In this case, laser fluence defines the ablation rate and any thickness of p-type GaN layer can be etched precisely. One example of such a laser is a femtosecond lasers at red or infra-red wavelengths. Here the top metal contact or other protective layers are used as a mask in this process. Alternatively, the laser beam size can be defined using special optics to match the desired etching region dimensions. In another example, shadow masks can be used to define the etching regions. Laser ablation etching may also be extended to the other layers of the LED structure. In this case, the individual LED devices are isolated fully or partially from each other. In this scenario, it may be required to passivate LED etched walls by depositing dielectric layers.

Figure 9A:
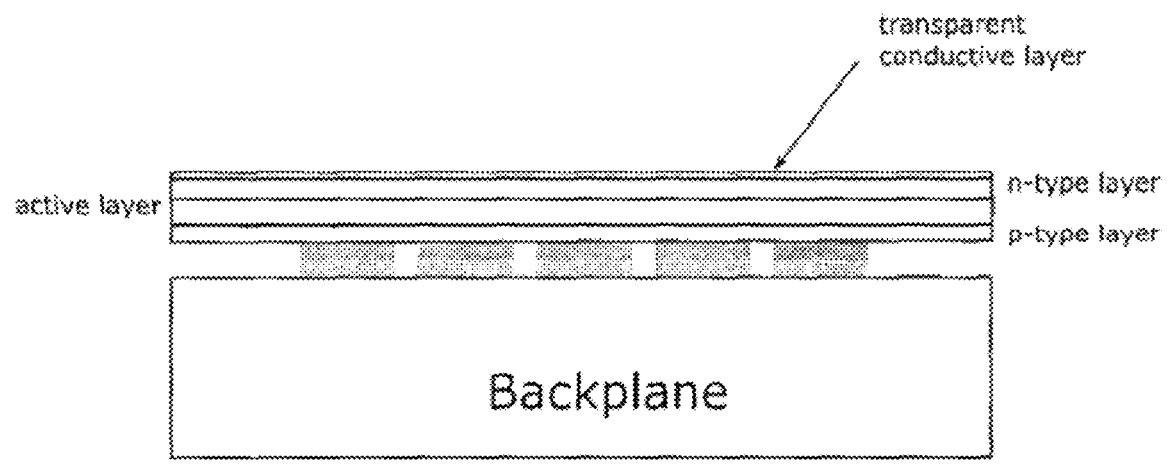
FIG. 9A illustrates a LED wafer with common transparent n-contact bonded to a backplane structure.

In the above-mentioned embodiments the n-layer contacts may be formed after the layer is exposed either by bonding and removing the LED wafer to the backplane circuitry or any other substrate, or by etching the substrate. In this scenario, the n-layer contact can be a transparent conductive layer to allow light illumination through this layer. In this case, the p-layer contact may be common for all or part of the bonded LEDs, as shown in FIG. 9A, which illustrates a LED wafer with common transparent n-contact bonded to a backplane structure. In cases where the LED device structure is grown on a semiconducting buffer layer, for example an undoped GaN substrate, after the LED transfer process this buffer layer can be removed to access the n-type layer. In the embodiment shown in FIG. 9A, the whole GaN buffer layer is removed using processes such as dry/wet etching.

Figure 9B:
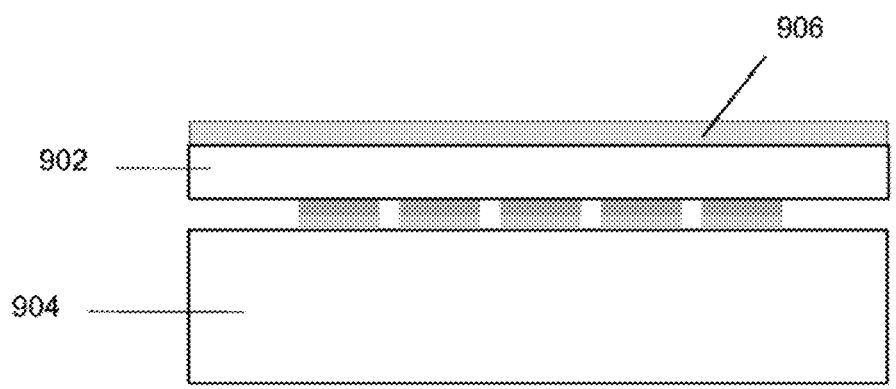
FIG. 9B shows an integrated device substrate with microdevices defined by top contacts bonded to a system substrate.

FIG. 9B shows an integrated device substrate with microdevices defined by top contacts bonded to a system substrate. A common electrode is formed on top of the structure. After transferring and bonding the device layer 902 which comprises a bottom p-type layer and top n-type layer, a common top electrode 906 may be deposited on the structure. For some optical device layers, the common top contact may be a transparent conductive layer. Substrate or backplane is 904.

Figure 9C:
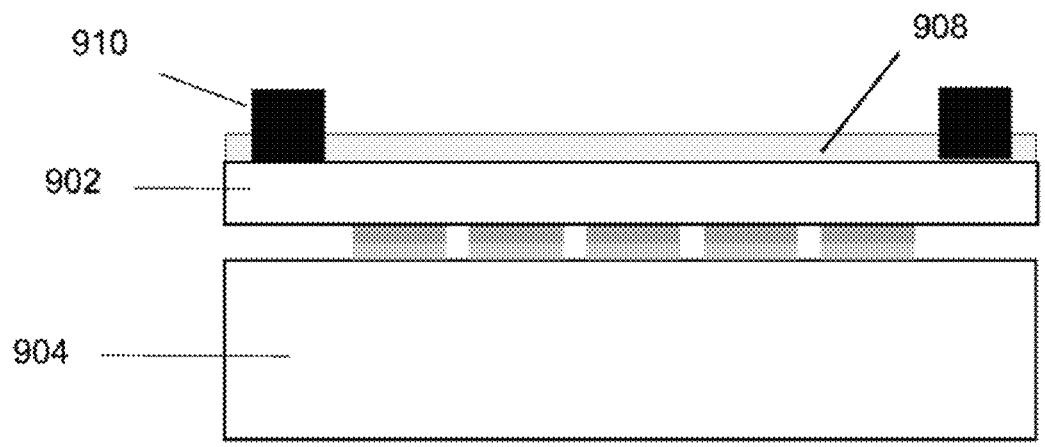
FIG. 9C shows a LED wafer with buffer layer and metallic n-contact vias.

FIG. 9C illustrates a LED wafer with buffer layer and metallic n-contact vias, and integrated device substrate with microdevices defined by top contacts bonded to a system substrate. Common electrodes are formed at the edges and through a buffer layer on top of the structure. As shown, the buffer layer is patterned around the edge thereby vias are made through the buffer layer to make metallic contacts to the n-type layer. The top layer of the integrated structure may be a layer with low conductivity. For example this layer may be a buffer layer used during the growth of device layer 902. In this cases, the common electrodes 910 may be formed by making vias through the buffer layer 908, for example at the edge of the structure.

Figure 9D:
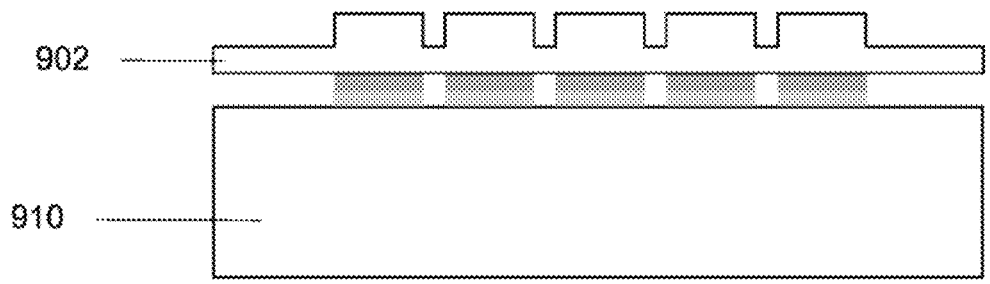
FIG. 9D shows an example of a transferred LED wafer with a patterned n-type layer.

FIG. 9D illustrates an example of a transferred LED wafer with a patterned n-type layer. Underneath the n-type layer is an active layer and a p-type layer, in order. To further decrease the lateral light propagation or adjust the device definition, as shown in FIG. 9D, the n-type layer is patterned by partially or fully removing this layer using the same structure as the front metallic contact. Alternatively, the layer thickness is reduced. The n-type contact can be made by depositing a transparent conductive layer on top of this structure. This integrated device substrate with microdevices defined by top contacts is bonded to a system substrate. The top of the structure is patterned to isolate microdevices electrically. The device layer 902 may be patterned or modulated to further isolate microdevices electrically and/or optically.

Figure 9E:
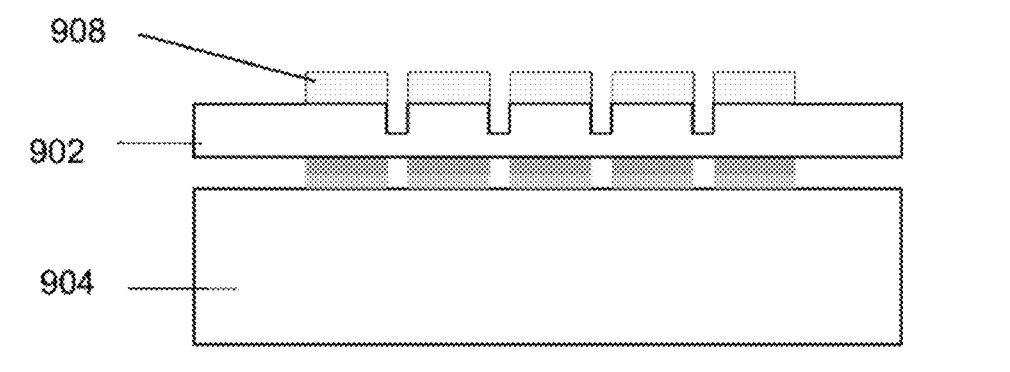
FIG. 9E shows an integrated device substrate with microdevices defined by top contacts bonded to a system substrate.
Figure 9E:
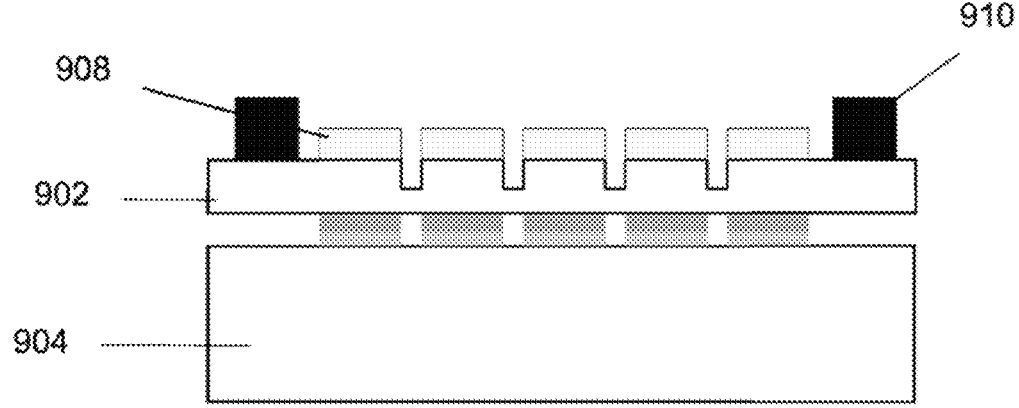

FIG. 9E illustrates another example of a transferred LED wafer with a patterned n-type layer. In cases where the buffer layer is present, both this layer and the n-type layer is patterned, as shown in FIG. 9D. In one embodiment the patterned grooves may be further processed and filled with a material that improves the light propagation through the patterned area. An example of this is surface roughening to suppress total internal reflection and a reflective material to prevent vertical light propagation in these regions. This integrated device substrate comprises microdevices defined by top contacts bonded to a system substrate. The top of the structure is patterned to isolate microdevices electrically and optically and common contacts are formed at the edge of the structure. If the buffer layer 908 exists, to isolate microdevices the buffer layer needs to be patterned or modulated as well. Similar to the embodiment shown in FIG. 9D, common contacts may be formed for example at the edge of the structure through vias in the buffer layer.

Figure 9F:
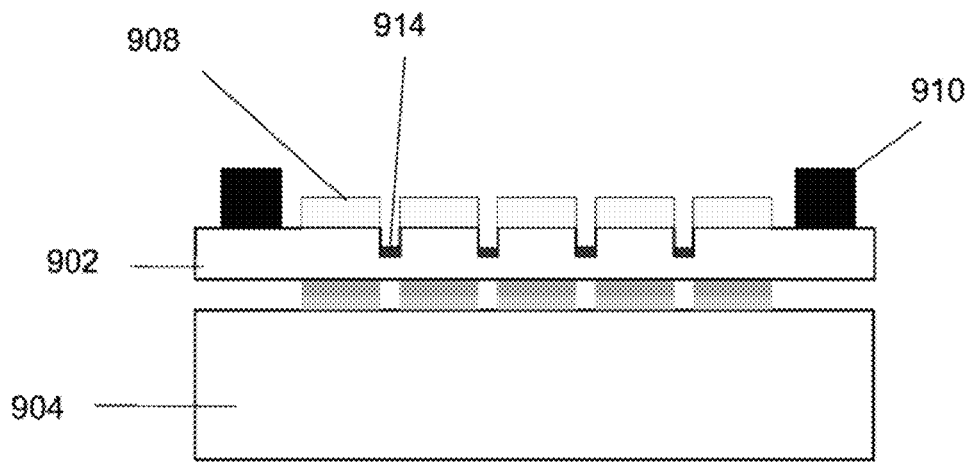
FIG. 9F shows an integrated device substrate with microdevices defined by top contacts bonded to a system substrate and optical elements formed between adjacent microdevices.
Figure 9G:
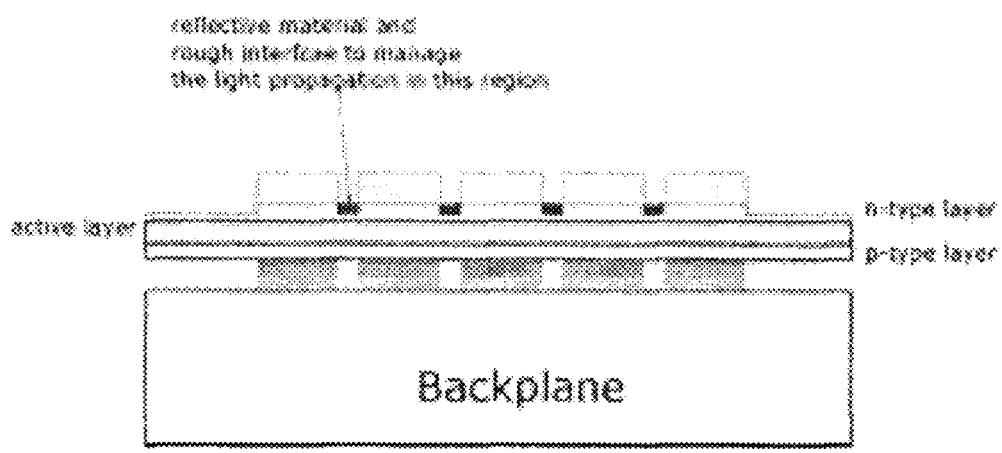
FIG. 9G illustrates an example of a transferred LED wafer with patterned n-type layer and light management scheme.

FIG. 9F shows an integrated device substrate with microdevices defined by top contacts bonded to a system substrate and optical elements formed between adjacent microdevices. As shown, the isolation regions may be filled by a layer or an stack of optical layers 914 to improve the performance of isolated microdevices. For example, in optical microdevices, the elements 914 may some reflective material to better out coupling the light generated by microdevices in a vertical direction. FIG. 9G illustrates an example of a transferred LED wafer with patterned n-type layer and light management scheme.

In LED display applications where display pixels are single device LEDs, each LED should be bonded to a driving circuit which controls the current flowing into LED devices. Here, the driving circuit may be a TFT (Thin Film Transistor) backplane conventionally used in LCD or OLED display panels. Due to the typical pixel sizes (10-50 µm), the bonding may be performed at a wafer level scale. In this scheme, an LED wafer consists of isolated individual LED devices are aligned and bonded to a backplane which is compatible with LED wafer in terms of pixel sizes and pixel pitches. Here, the LED wafer substrate may be removed using various processes such as laser lift-off or etching. In this case, it is important to isolate the LED devices by dry etching and passivation layers.

In one embodiment, the LED wafer is fabricated in which for example the p-type layer is the top layer. The p-type layer thickness and conductivity is manipulated to control the lateral conduction. This may be done by either etching of the pre-deposited p-layer or by depositing a thinner p-layer during the LED structure fabrication. For etching scenario, an accurate thickness control can be achieved using dry etching process. In addition, the material structure of the p-layer can be modified in terms of the layer doping level to increase the layer's lateral resistance. One should note that the top layer is not limited to the p-layer and can be extended to other top layers in an LED structure. As a result of this modification, the illumination area can be defined solely by the deposited conductive layer area on top of the p-type film.

To further limit the lateral illumination, the p-type layer between two adjacent pixels can be fully or partially etched. This process step may be done after the conductive layer deposition in a process such as dry etching. In this case, the conductive layer may be used as a mask. One important advantage of this scheme is to eliminate the wall passivation of pixels which results in higher number of pixels in a specific area of the wafer, or higher pixels-per-inch (PPI). This may also be translated to the less process steps and lower fabrication cost compared to fully isolated LEDs with wall passivation.

Figure 9H:
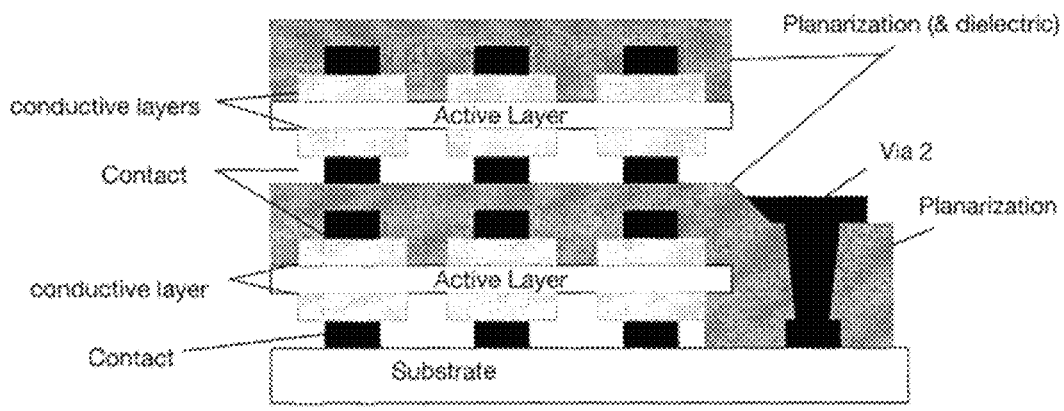
FIG. 9H illustrates stacked devices with isolation methods.

In another example, another device layer can be transferred on top of existing transfer devices. FIG. 9H illustrates stacked devices with isolation methods and shows a stacked device using planarization layer and dielectric layer between two stacked devices to separate the devices. It is noted that any of the layers can be eliminated. In one case, the surface of the transferred device is planarized first. Then vias can be opened to create contact to the backplane. This contact can be at edge or in the middle of the arrays. The contact layer comprising traces and islands are then deposited and patterned. Finally the second set of devices are transferred. This process can continue for transferring additional devices. In another case, the top contact of first device can be shared with bottom contact of the second device. In this case, one can eliminate the planarization layer.

Figure 10A:
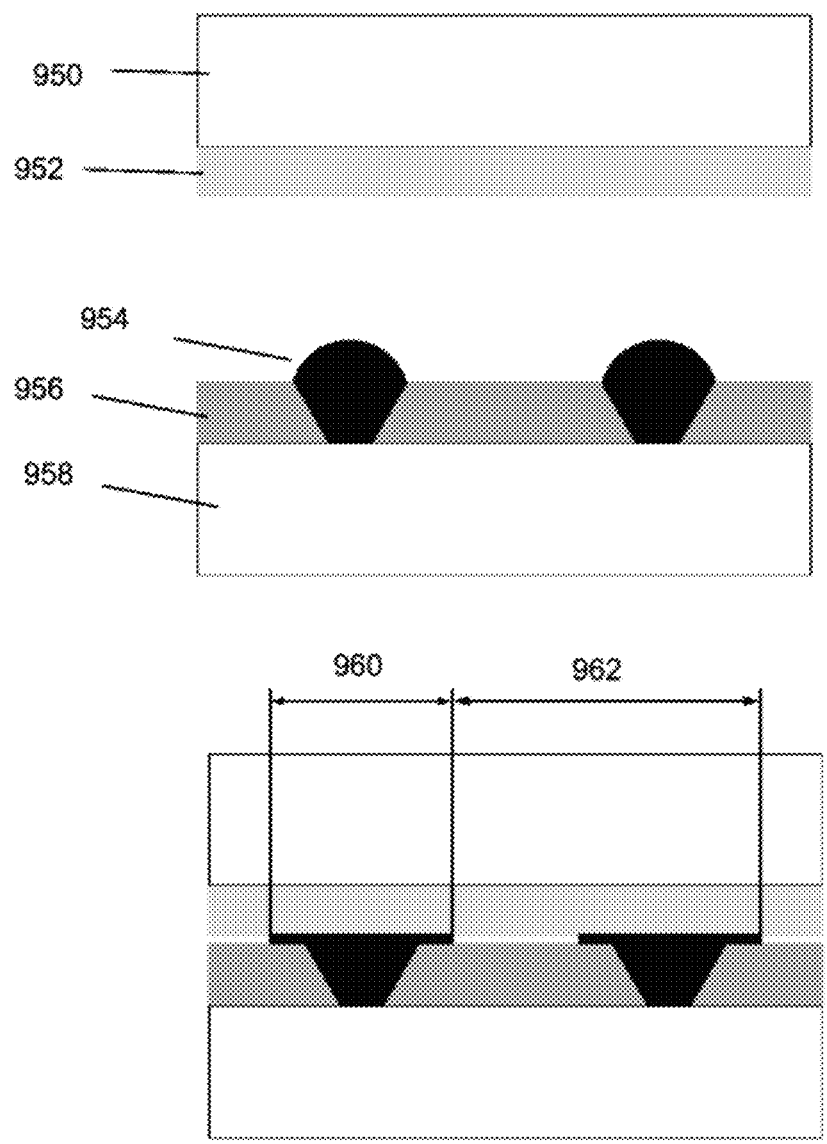
FIG. 10A shows the integration process of a device substrate and a system substrate.

In another embodiment as shown in FIG. 10A, the system substrate contact pads or bumps 954 may define the microdevice areas. FIG. 10A shows the integration process of a device substrate and a system substrate. The microdevices in the integrated structure is partially defined by the contact bumps on the system substrate. In this case, the device layer 952 does not have any top contact to define the microdevice area. The device layer 952 on the substrate 950 is bonded to a system substrate 958 with an array of contact pads or bumps 954 separated by insulation layer 956. Here the bonding is made between the metallic contact pads 954 and the device layer 952. This bonding process may be performed using any bonding procedure such as but not limited to the heat and/or pressure bonding or laser heating bonding. An advantage of this procedure is the elimination of the alignment process during the microdevice transfer to the system substrate. Here the microdevice size 960 and the pitch 962 is partially defined by the size of the contact pad/bump 954. In one example, the device layer 952 may be LED layers on a sapphire substrate 950 and the system substrate 958 may be a display backplane with circuitry required to drive individual micro-LEDs defined partially by the contact bumps on the backplane.

Figure 10B:
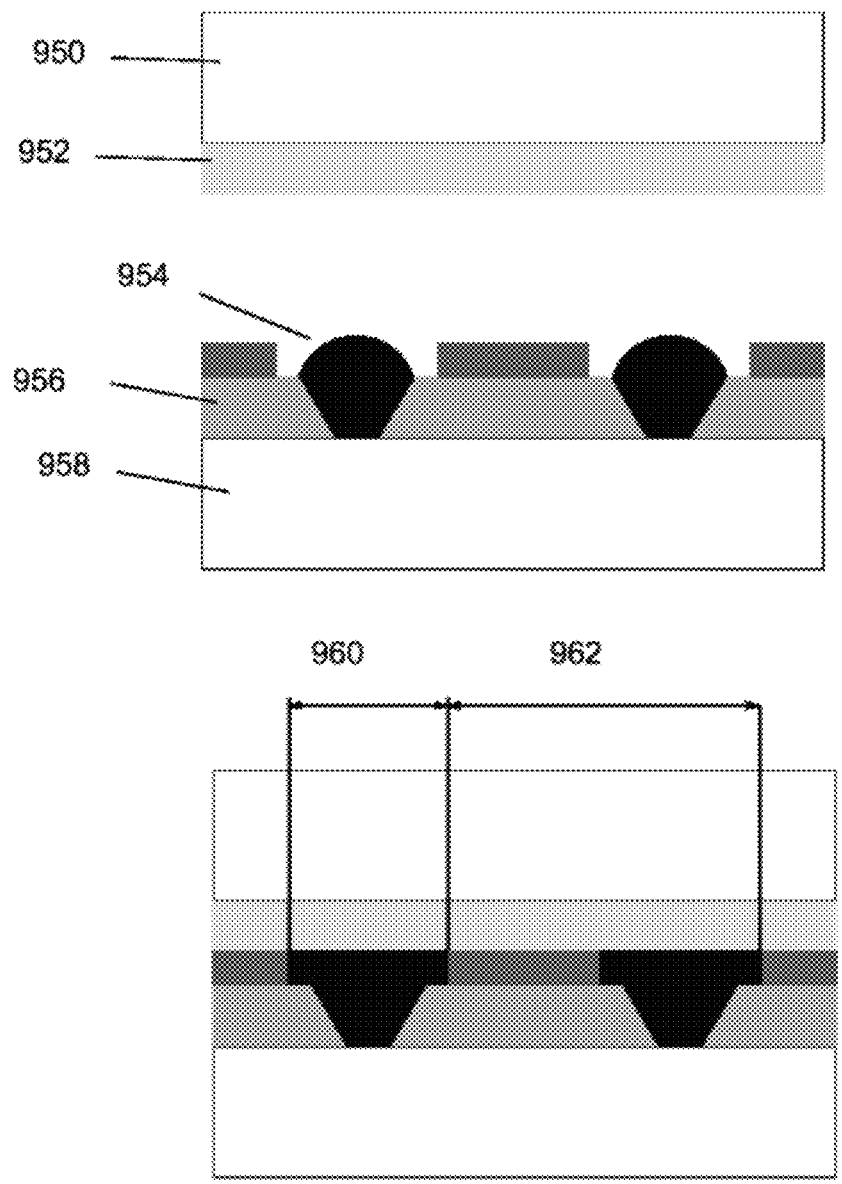
FIG. 10B shows the integration process of a device substrate and a system substrate.

FIG. 10B shows the integration process of a device substrate and a system substrate. The microdevices in the integrated structure is fully defined by the contact bumps on the system substrate. To precisely define the microdevice size 960 and microdevice pitch 962, a bank layer is deposited and patterned on the system substrate. The bank layer opening around each contact pad 954 will fully define the microdevice size 960 and microdevice pitch 962. In one embodiment, the bank layer may be an adhesive material.

Figure 10C:
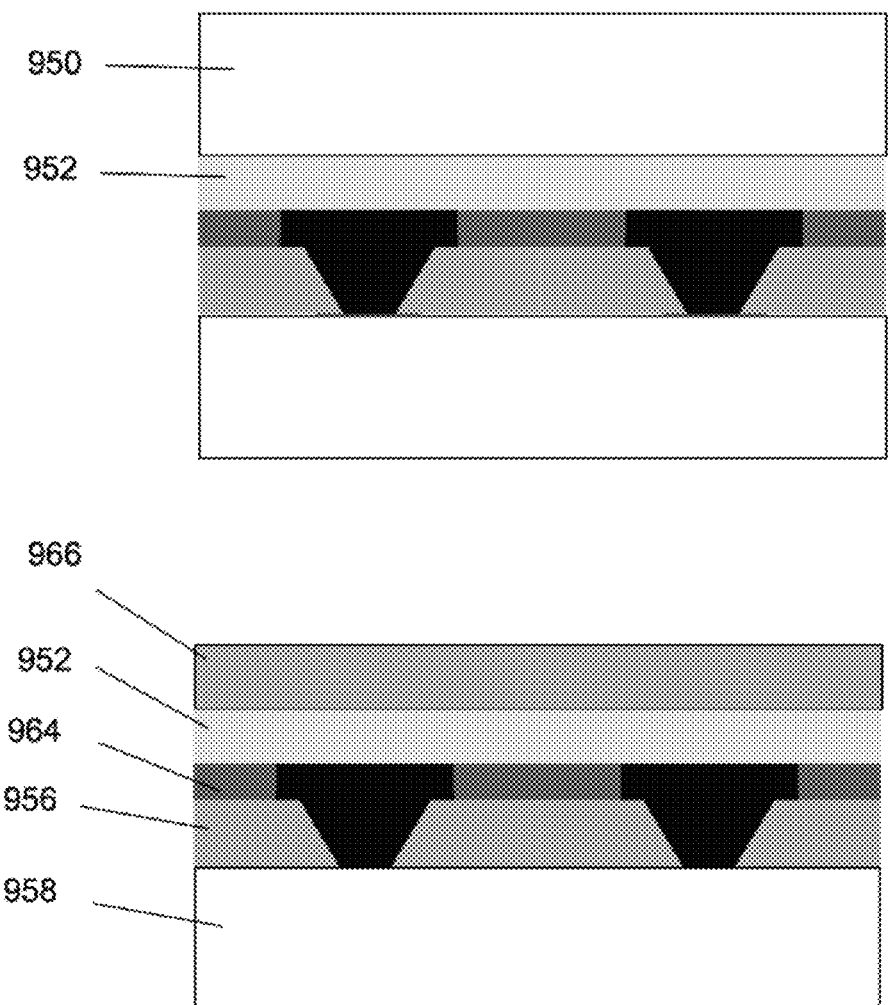
FIG. 10C shows an integrated device substrate transferred and bonded to a system substrate.

FIG. 10C shows an integrated device substrate transferred and bonded to a system substrate. A common electrode is formed on top of the structure. After bonding the microdevice substrate to the system substrate, as it is shown in FIG. 10C, the microdevice substrate 950 may be removed using various methods and a common contact may be formed above the integrated structure. In case of optical microdevices such as but not limited to micro-LEDs this common electrode may be a transparent conductive layer. Here a bank structure 964 is used to eliminate the short between adjacent pads after possible spreading effect due to pressure. Also a other layers 966 such as common electrode, color conversion layer and so on can be deposited after the bonding.

Figure 10D:
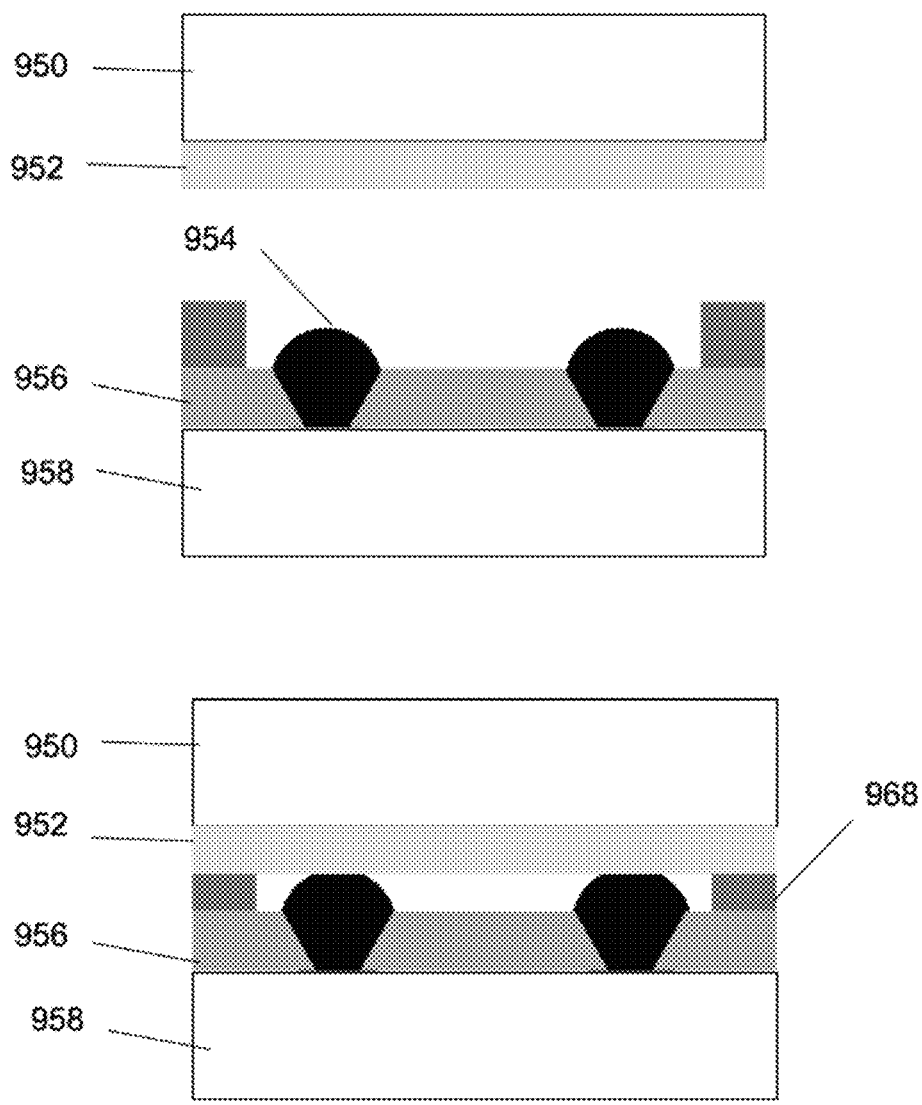
FIG. 10D shows an integrated structure with transferred device layers and bonding element at the edge of the backplane.

FIG. 10D shows an integrated structure with transferred device layers and bonding element at the edge of the backplane. In this embodiment, adhesive bonding elements 968 may be used at the edge of the backplane to bond the device layer 952 to the system substrate. In one case, the bonding elements 968 may be used to temporarily hold the device layer to the system substrate for the bonding process of contact pads to the device layer. In another case, the bonding element 968 permanently attach the microdevice layer 952 to the system substrate.

Figure 10E:
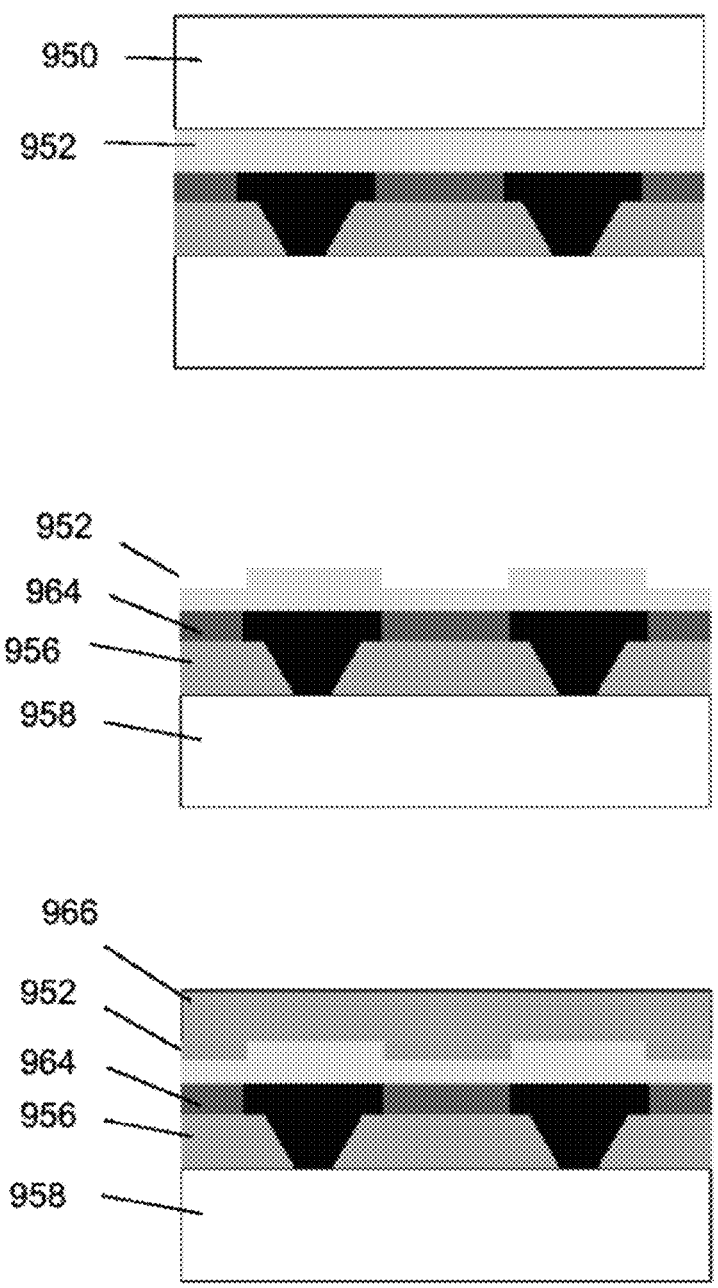
FIG. 10E shows the integration process of a device substrate and system substrate with post bonding patterning and common electrode.

FIG. 10E shows an integration process of a device substrate and system substrate with post bonding patterning and common electrode. In this embodiment, the device layer 952 may be patterned after transferring to the system substrate. The patterning 970 may be designed and implemented to isolate microdevices electrically and/or optically. After patterning the device layer a common electrode may be deposited on the integrated substrate. In the case of optical devices such as LEDs, the common electrode may be a transparent conductive layer.

Figure 10F:
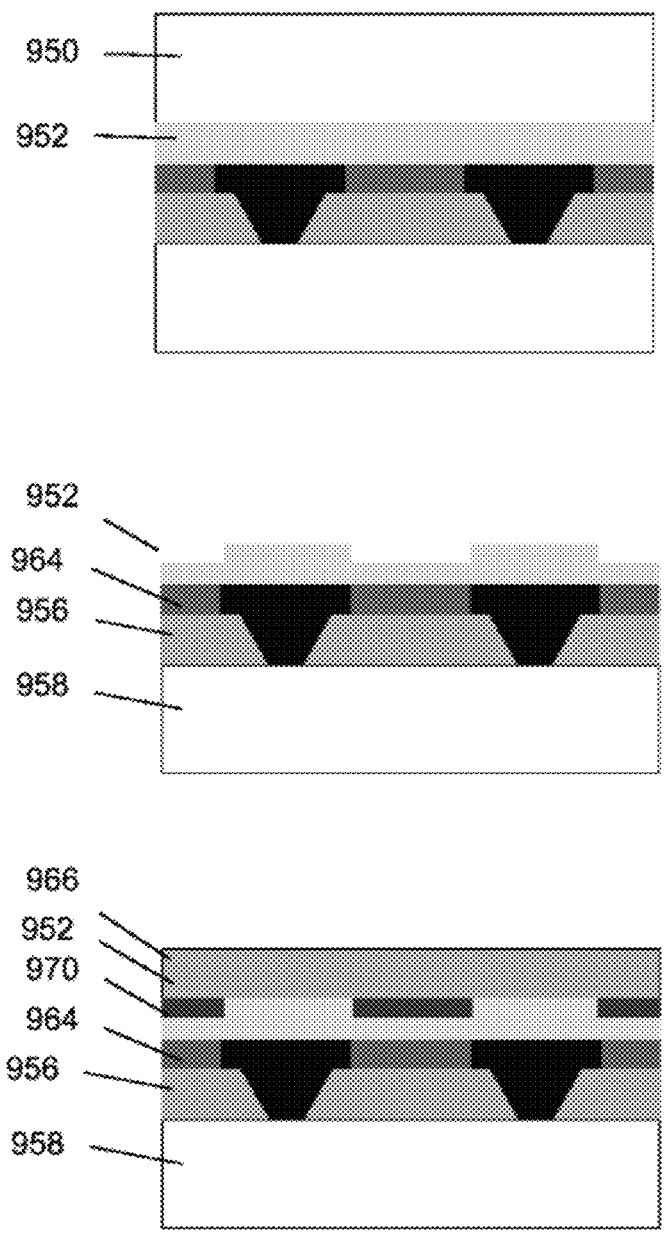
FIG. 10F shows the integration process of a device substrate and system substrate with post bonding patterning, optical element, and common electrode formation.

FIG. 10F shows an integration process of a device substrate and system substrate with post bonding patterning, optical element, and common electrode formation. As shown, after transferring and patterning the device layer 952, additional layers may be deposited and/or formed between isolated microdevices to enhance the performance of microdevices. In one example, these elements may passivate the sidewalls of the isolated microdevices to help to vertical out coupling of light in the case of optical microdevices such as but not limited to the micro-LEDs.

In the presently explained methods, a protective layer may be finally formed on top of the integrated structure to act as a barrier and scratch resistance layer. Also some can deposit an opaque layer after the microdevice and patterns it to form the pixel. This layer can sit anywhere in the stack. The opening will allow the light to go through only the pixel array and reduce the interference.

The microdevices as described herein can be developed, for example, by etching wafer and forming mesa structures. Mesa formation can be done using dry or wet etching technique. Reactive ion etching (RIE), inductive coupled plasma (ICP)-RIE and chemical assisted ion beam etching (CAME) can be employed for dry etching of the wafer substrate. Chlorine based gases such as $Cl_2$, $BCl_3$ or $SiCl_4$ can be used to etch wafer. Carrier gases including but not limited to Ar, $O_2$, Ne and $N_2$ may be introduced into the reactor chamber in order to increase degree of anisotropic etching and sidewall passivation.

Figure 11:
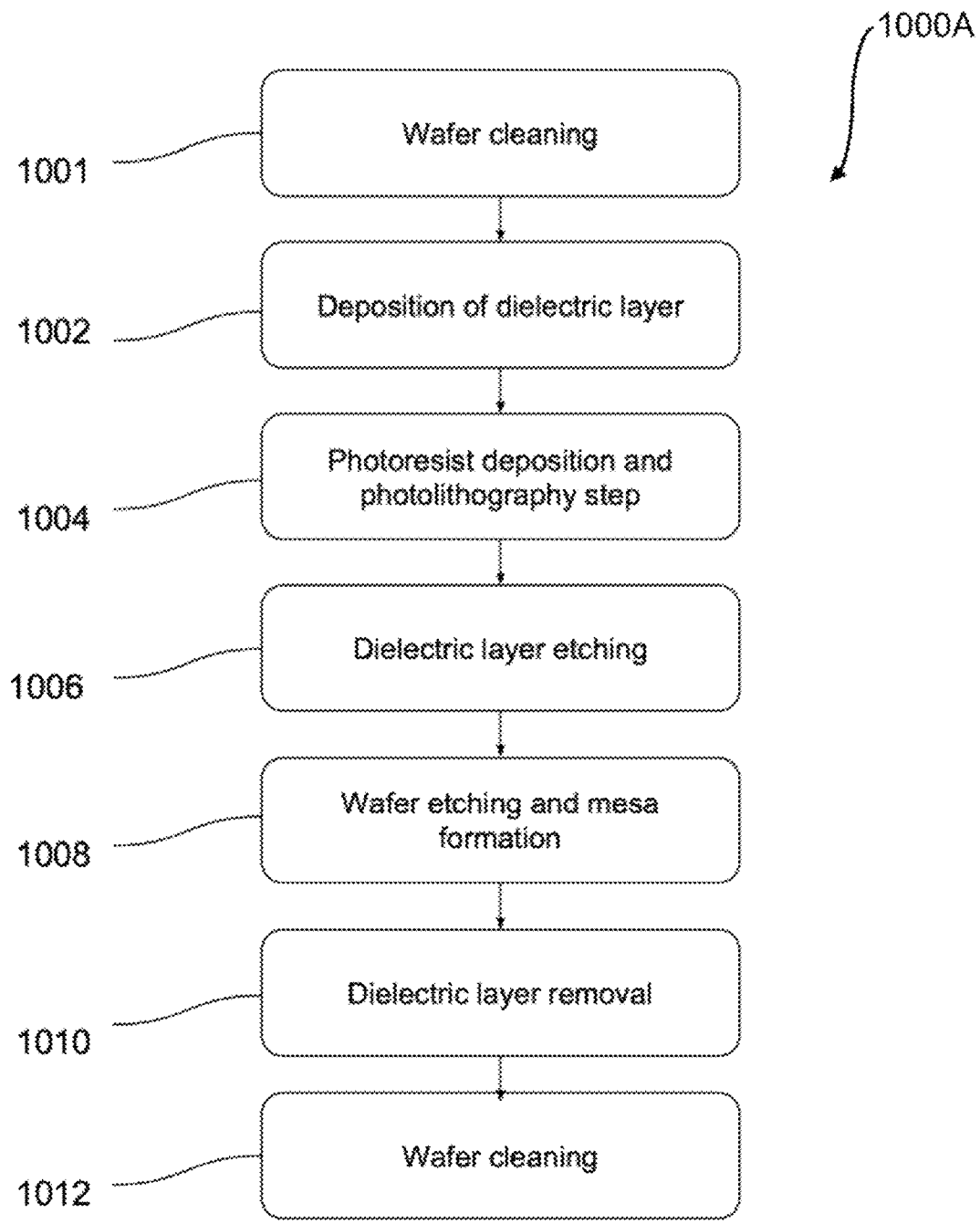
FIG. 11 shows a process flowchart of a wafer etching process for mesa structure formation.

FIG. 11 shows a process flowchart 1000A of a wafer etching process for mesa structure formation. Referring to FIG. 11, in step 1001 the wafers are cleaned using piranha etching containing sulfuric acid and hydrogen peroxide followed by hydrochloric diluted DI water cleaning step. Step 1002 is deposition of the dielectric layer. In step 1006 the dielectric layer is etched to create an opening on the layer for subsequent wafer etching. In step 1008 the wafer substrate is etched using dry etching technique and chlorine chemistry to develop mesa structures. In step 1010, hard mask is removed by wet or dry etching method, and the wafer is subsequently cleaned.

Figure 12A:
FIG. 12A shows a device with dielectric layer deposition on the wafer surface.

FIG. 12A shows a device with dielectric layer 1202 deposition on the wafer surface 1202. Following the wafer cleaning step, a hard mask 1204 is formed on the wafer surface. In an embodiment, a dielectric layer 1204 such as $SiO_2$ or $Si_3N_4$ is formed on the wafer substrate using appropriate deposition technique such as plasma-enhanced chemical vapour deposition (PECVD). Photoresist 1206 is then applied on the dielectric layer. In the photolithography step, a desired pattern is formed on the photoresist layer. For example PMMA can be formed on the dielectric layer followed by a direct e-beam lithography technique to form an opening on the PMMA.

Figure 12B:
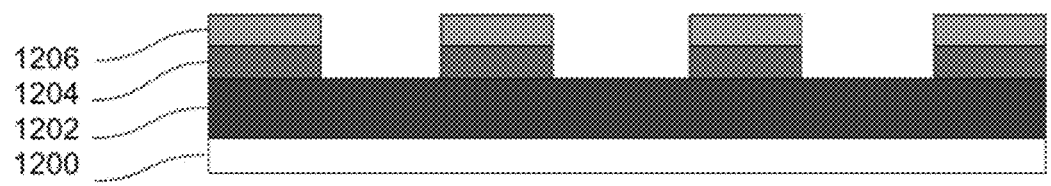
FIG. 12B shows a device with a dielectric layer etched to create an opening on the layer for subsequent wafer etching.

FIG. 12B shows a device with a dielectric layer 1202 on a wafer 1200 etched to create an opening on the layer for subsequent wafer etching. A dielectric layer is etched to create an opening on the layer for subsequent wafer etching. As shown in FIG. 12B, a dry etch method with fluorine chemistry can be employed to selectively etch the dielectric layer. Carrier gases including but not limited to $N_2$, Ar, $O_2$ can be introduced to control degree of anisotropic etching. Gas flow rate and mixture ratio, type of carrier gases, RF and dc powers, as well as substrate temperature can be adjusted to achieve desired etching rate and high degree of anisotropy.

Figure 12C:
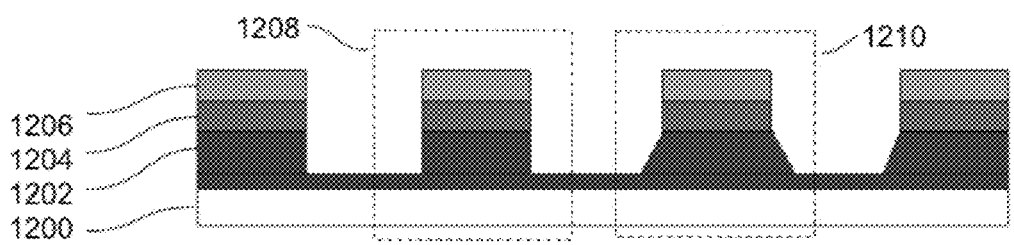
FIG. 12C shows mesa structures after a wafer substrate etching step.

FIG. 12C shows mesa structures after wafer substrate etching step. In one embodiment, mesa structures 1208 with straight side walls can be formed. In another embodiment mesa structures 1210 with sloped side walls can be formed. The gas mixture ratio, type of gases in the reactor and relevant etching conditions can be adjusted in order to modify slope of the side wall. Depending on the desired mesa structure, a straight, positive and negative slope side wall may be formed. In an embodiment, sidewall passivation during the etching step may be used to create a desired sidewall profile. In addition, a cleaning step may be used to remove passivation layer or native oxide from the side-wall. Cleaning can be done using acetone, isopropyl alcohol followed by surface treatment using $(NH_4)_2$ and/or $NH_4OH$.

Figure 13:
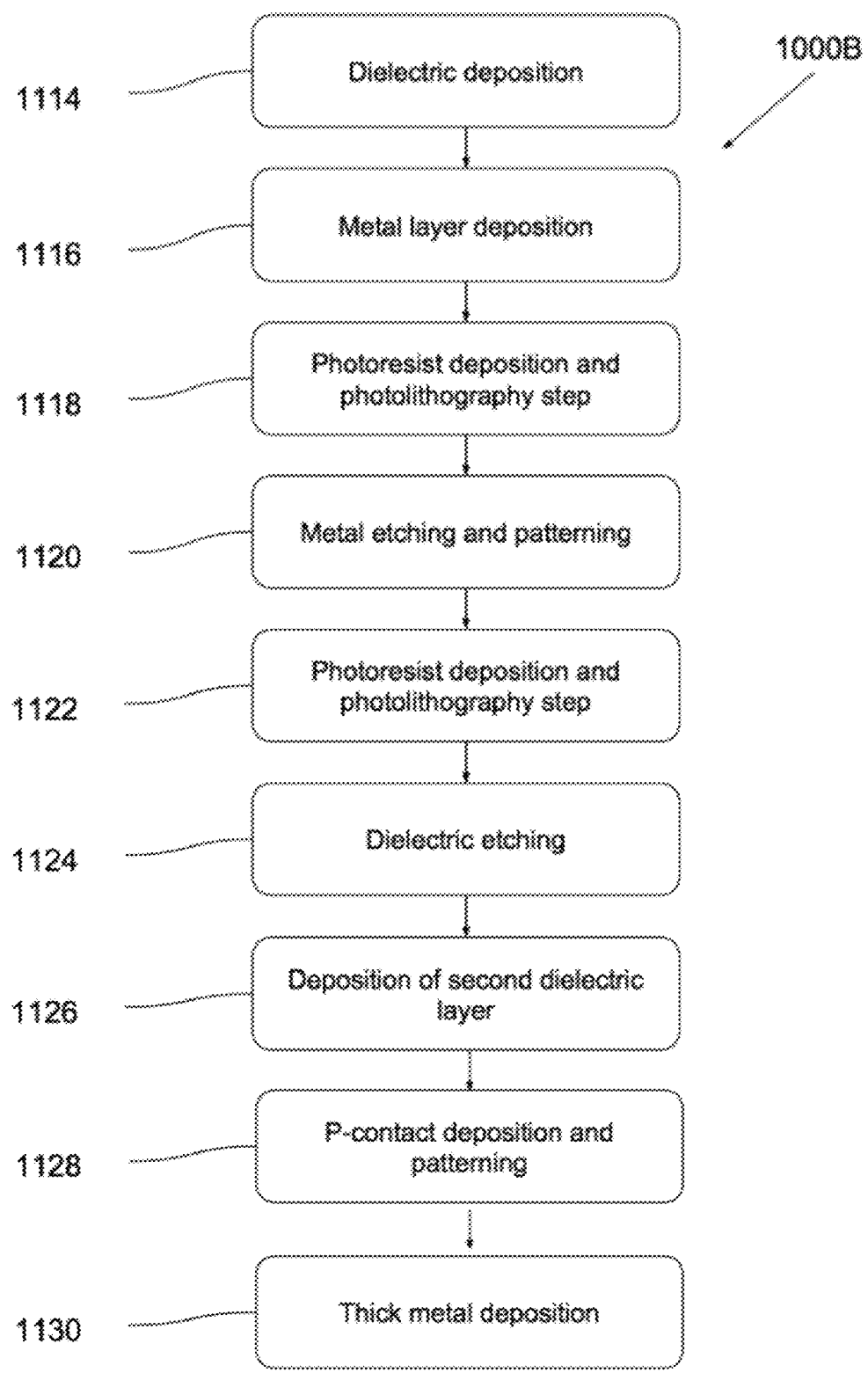
FIG. 13 shows process flowchart for formation of an MIS structure.

In an embodiment, a MIS structure may be formed after mesa structure formation. FIG. 13 shows a process flow 1000B for formation of MIS structure. In process steps 1114 and 1116, dielectric and metal layers are deposited on mesa structures to form MIS structures. Following the deposition of dielectric layer, in process 1116, metal film is deposited on the layer using variety of methods such as thermal evaporation, e-beam deposition and sputtering. In process step 1118, a desired pattern is formed on the wafer using photolithography step. In step 1120, metal is etched using dry or wet etching forming an opening on the top side of the mesa structure above the dielectric layer. In step 1122, a photolithography step may be used to define the dielectric etch area. In another embodiment etched metal layer may be used as a mask for etching the dielectric layer. In step 1126, a second dielectric layer may deposited on the metal interlayer. In step 1128, an ohmic p-contact is deposited on the wafer, as shown in FIG. 14E. In process step 1130, thick metal is deposited on p-contact for subsequent bonding of mesa structures to temporary substrate in wafer lift-off process steps from the native substrate, as shown in FIG. 14E.

Figure 14A:
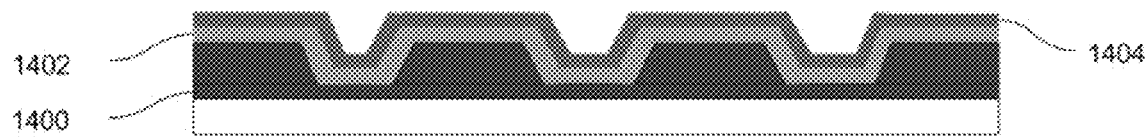
FIG. 14A shows a dielectric and metal layer deposited on a mesa structure to form an MIS structure.

FIG. 14A shows a dielectric and metal layer deposited on a mesa structure to form a MIS structure. Dielectric 1402 and metal layer 1404 are deposited on mesa structures 1400 to form MIS structures. A variety of dielectric layers can be used which include but are not limited to $Si_3N_4$ and oxides such as $SiO_2$, $HfO_2$, $Al_2O_3$, $SrTiO_3$, Al-doped $TiO_2$, $LaLuO_3$, $SrRuO_3$, HfAlO and $HMO_x$. The thickness of the dielectric layer may be a few nanometer or micrometer. A variety of methods such as CVD, PVD or e-beam deposition may be used to deposit dielectric layer. In an embodiment, a high-k oxide dielectric layer may be deposited using atomic layer deposition (ALD) method. ALD allows very thin and high-K dielectric layer to be formed on the wafer. During ALD deposition of dielectric oxide layer, precursors are introduced in the reaction chamber sequentially to form a thin insulator layer. Metal precursors include halides, alkyls and alkoxides and beta-deketonates. Oxygen gas can be provided using water, ozone or $O_2$. Depending on the process chemistry, dielectric film deposition may be done at room temperature or at elevated temperature. Deposition of $Al_2O_3$ can also be done using trimethylaluminum (TMA) and water precursors. For $HfO_2$ ALD deposition, $HfCl_4$ and $H_2O$ precursors may be used. Metal electrodes serve as biasing contacts for electric field modulation in the device. Metal contacts include but not limited to Ti, Cr, Al, Ni, Au or metal stack layer.

Figure 14B:
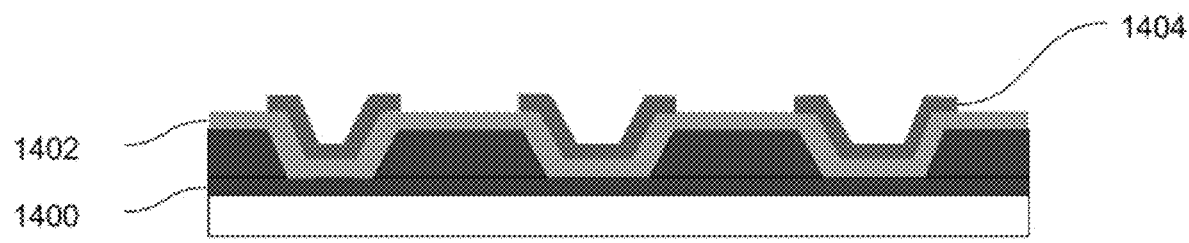
FIG. 14B shows a wafer with a pattern formed using photolithography step.
Figure 14C:
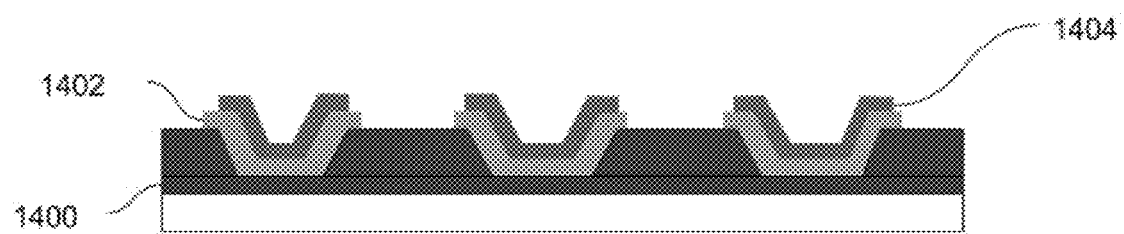
FIG. 14C shows a wafer with a dielectric layer dry etched using fluorine chemistry.
Figure 14D:
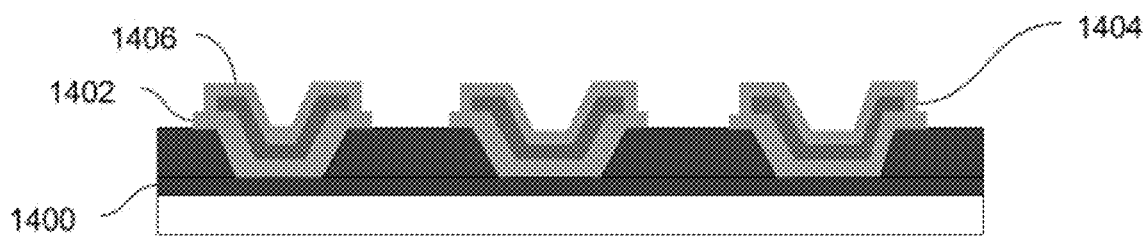
FIG. 14D shows a wafer with a second dielectric layer.
Figure 14E:
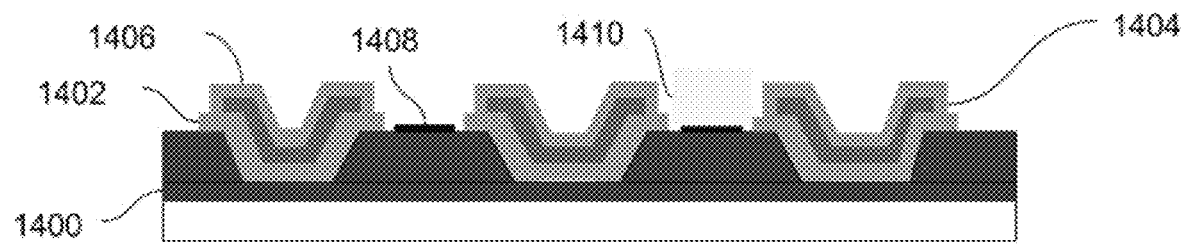
FIG. 14E shows a wafer with an ohmic p-contact.

FIG. 14B shows a wafer with a pattern formed using photolithography step. FIG. 14C shows a wafer with a dielectric layer dry etched using fluorine chemistry. Etch stop is the top surface of the mesa structure. As shown in FIG. 14D, a second dielectric layer 1406 may deposited on the metal interlayer for subsequent p-contact deposition in order to prevent shorting with device functional electrode. Subsequently, dielectric layer on top of the mesa structure is etched to create an opening on the top surface of mesa structure.

Shown in FIG. 14E, ohmic p-contact 1408 is deposited on the wafer. P-contact may be deposited using thermal evaporation, sputtering or e-beam evaporation. Au alloys such as Au/Zn/Au, AuBe, Ti/Pt/Au, Pd/Pt/Au/Pd, Zn/Pd/Pt/Au, Pd/Zn/Pd/Au may also be used for p-contact layer. Subsequent patterning step removes metal from unwanted area allowing contact to be formed only on top surface of the mesa structure. A thick metal 1410 can deposited on p-contact for subsequent bonding of mesa structures to temporary substrate in wafer lift-off process steps from the native substrate.

The scope of this invention is not limited to LEDs. One can use these methods to define the active area of any vertical device. Different methods such as laser lift-off (LLO), lapping, wet/dry etching may be used to transfer microdevices from one substrate to another. Microdevices may be first transferred to another substrate from a growth substrate and then transferred to the system substrate. This present devices are further not limited to any particular substrate. Mentioned methods can be applied on either n-type or p-type layer. For the example LED structures above n-type and p-type layers position should not limit the scope of invention.

While the present disclosure is susceptible to various modifications and alternative forms, specific embodiments or implementations have been shown by way of example in the drawings and are described in detail herein. It should be understood, however, that the disclosure is not intended to be limited to the particular forms disclosed. Rather, the disclosure is to cover all modifications, equivalents, and alternatives falling within the spirit and scope of an invention as defined by the appended claims.

The invention claimed is:

1. A method of creating an array of current driven devices in a continuous semiconductor bulk by resistance engineering, the resistance engineering including:
    forming device layers on a substrate;
    forming an array of contact pads on top of the device layers;
    forming a metal-insulator-semiconductor structure around the contact pads;
    after the forming the device layers, the array of contact pads, and the metal-insulator-semiconductor structure, manipulating a resistance of an area of a conductive top layer between adjacent contact pads within the continuous semiconductor bulk to limit lateral current flow components; and
    after the forming the device layers, the array of contact pads, and the metal-insulator-semiconductor structure, biasing the metal-insulator-semiconductor structure to force current vertically in the device layers.

2. The method of claim 1, wherein a contact area of the contact pads is defined to limit the lateral current flow.

3. The method of claim 1, wherein the device layers are formed on the substrate with non-connected pillar structures such that no lateral current component exists in the device layers.

4. A method of creating an array of current driven devices in a continuous semiconductor bulk by resistance engineering, the resistance engineering including:
    forming device layers on a substrate with non-connected pillar structures such that no lateral current component exists in the device layers;
    forming an array of contact pads on top of the device layers;
    forming a metal-insulator-semiconductor structure around the contact pads; and
    after the forming the device layers, the array of contact pads, and the metal-insulator-semiconductor structure, biasing the metal-insulator-semiconductor structure to force current vertically in the device layers.

* * * * *